(12) United States Patent
Miao et al.

(10) Patent No.: US 12,119,308 B2
(45) Date of Patent: Oct. 15, 2024

(54) PACKAGING STRUCTURE OF SEMICONDUCTOR CHIP AND FORMATION METHOD THEREOF

(71) Applicant: TONGFU MICROELECTRONICS CO., LTD., Nantong (CN)

(72) Inventors: Xiaoyong Miao, Nantong (CN); Honghui Wang, Nantong (CN)

(73) Assignee: TONGFU MICROELECTRONICS CO., LTD., Nantong (CN)

( * ) Notice: Subject to any disclaimer, the term of this patent is extended or adjusted under 35 U.S.C. 154(b) by 312 days.

(21) Appl. No.: 17/629,549

(22) PCT Filed: Jul. 17, 2020

(86) PCT No.: PCT/CN2020/102758
§ 371 (c)(1),
(2) Date: Jan. 24, 2022

(87) PCT Pub. No.: WO2021/017896
PCT Pub. Date: Feb. 4, 2021

(65) Prior Publication Data
US 2022/0270982 A1    Aug. 25, 2022

(30) Foreign Application Priority Data

Jul. 26, 2019 (CN) .......................... 201910681470.1
Jul. 26, 2019 (CN) .......................... 201910681473.5
(Continued)

(51) Int. Cl.
*H01L 23/552* (2006.01)
*H01L 21/56* (2006.01)
(Continued)

(52) U.S. Cl.
CPC .......... *H01L 23/552* (2013.01); *H01L 21/561* (2013.01); *H01L 21/563* (2013.01);
(Continued)

(58) Field of Classification Search
CPC .......... H01L 23/3128; H01L 23/49811; H01L 23/49822; H01L 23/552; H01L 21/563;
(Continued)

(56) References Cited

U.S. PATENT DOCUMENTS 5,639,989 A * 6/1997 Higgins, III .......... H01L 23/552
                                                         174/394
9,620,463 B2 * 4/2017 Kim ........................ H01L 24/96
(Continued)

FOREIGN PATENT DOCUMENTS

CN        102347313  A       2/2012
CN        103915355  A       7/2014
(Continued)

OTHER PUBLICATIONS

Xu, Ziyang, CN 102347313A "Packaging structure for integrated circuit chip", Pulished Feb. 8, 2012 (Year: 2012).*
(Continued)

*Primary Examiner* — Khiem D Nguyen
(74) *Attorney, Agent, or Firm* — Anova Law Group, PLLC

(57) ABSTRACT

A packaging structure and fabrication method thereof are provided. The method includes: providing semiconductor chips including soldering pads and metal bumps; providing a base plate, wiring structures, input terminals, and output terminals; mounting the semiconductor chips on the front surface of the base plate inversely, such that each metal bump is connected to a corresponding input terminal; forming a bottom filling layer between a functional surface of each semiconductor chip and the front surface of the base
(Continued)

plate; forming a first shielding layer covering a non-functional surface and sidewalls of each semiconductor chip, and covering sidewalls of a corresponding bottom filling layer; forming a second shielding layer on each first shielding layer; forming a plastic encapsulation layer on second shielding layers and on a portion of the base plate between semiconductor chips; and forming external contact structures connected to the output terminals.

20 Claims, 8 Drawing Sheets

(30) Foreign Application Priority Data

Jul. 26, 2019 (CN) .......................... 201910681479.2
Jul. 26, 2019 (CN) .......................... 201910681793.0

(51) Int. Cl.
*H01L 23/00* (2006.01)
*H01L 23/498* (2006.01)

(52) U.S. Cl.
CPC .. *H01L 23/49811* (2013.01); *H01L 23/49822* (2013.01); *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01)

(58) Field of Classification Search
CPC ......... H01L 2224/16227; H01L 21/561; H01L 24/03; H01L 24/05; H01L 24/11; H01L 24/13; H01L 24/16; H01L 24/32; H01L 24/73; H01L 24/81; H01L 24/83; H01L 24/94; H01L 24/97
See application file for complete search history.

(56) References Cited

U.S. PATENT DOCUMENTS

| | | | |
|---|---|---|---|
| 10,242,954 B2* | 3/2019 | Kawabata | H01L 23/295 |
| 2011/0229708 A1* | 9/2011 | Asami | H01L 24/97 |
| | | | 428/316.6 |
| 2012/0008290 A1* | 1/2012 | Takahashi | H05K 3/4691 |
| | | | 361/749 |
| 2013/0228904 A1* | 9/2013 | Brunnbauer | H01L 23/552 |
| | | | 257/659 |
| 2014/0048913 A1 | 2/2014 | Park et al. | |
| 2015/0221598 A1* | 8/2015 | Lee | H10B 61/22 |
| | | | 257/295 |
| 2015/0287697 A1* | 10/2015 | Tsai | H01L 24/97 |
| | | | 257/773 |
| 2016/0035696 A1* | 2/2016 | Tao | H01L 21/565 |
| | | | 438/113 |
| 2020/0075537 A1* | 3/2020 | Luo | H01L 25/0652 |

FOREIGN PATENT DOCUMENTS

| | | |
|---|---|---|
| CN | 105336629 A | 2/2016 |
| CN | 105552061 A | 5/2016 |
| CN | 110473844 A | 11/2019 |
| CN | 110518002 A | 11/2019 |
| CN | 110534442 A | 12/2019 |
| CN | 110544677 A | 12/2019 |

OTHER PUBLICATIONS

World Intellectual Property Organization (WIPO) International Search Report for PCT/CN2020/102758 Oct. 21, 2020 4 Pages.

* cited by examiner

PACKAGING STRUCTURE OF SEMICONDUCTOR CHIP AND FORMATION METHOD THEREOF

CROSS-REFERENCE TO RELATED APPLICATIONS

This application is a national phase entry under 35 U. S. C § 371 of International Application No. PCT/CN2020/102758, filed on Jul. 17, 2020, which claims the priority of Chinese Patent Application No. 201910681793.0, filed on Jul. 26, 2019, Chinese Patent Application Ser. No. 20/191, 0681479.2, filed on Jul. 26, 2019, Chinese Patent Application No. 201910681470.1, filed on Jul. 26, 2019, and Chinese Patent Application No. 201910681473.5, filed on Jul. 26, 2019, the entire contents of all of which are incorporated herein by reference in their entirety.

TECHNICAL FIELD

The present disclosure generally relates to the field of semiconductor technologies and, more particularly, relates to a packaging structure with electromagnetic shielding and its fabrication method.

BACKGROUND

With the rapid development of a new generation of electronic products, integrated circuit packaging technology has developed towards a direction of high density, high frequency, miniaturization, and high integration level. Strong electromagnetic waves may often be generated from high-frequency chips, which induces undesirable interference or noise on chips in or out the packaging structures. The density of electronic devices also increases and distances between transmission wires become closer. Correspondingly, electromagnetic interference issues from inside or outside of integrated circuit packages becomes more severe gradually. The quality and service life of the integrated circuits are also reduced.

In electronic devices and electronic products, electromagnetic interference (EMI) energy is transmitted through conductive coupling and radiative coupling. To meet requirements of electromagnetic compatibility, filter technologies are needed for the conductive coupling, that is, EMI filter devices are used for suppressing the electromagnetic interference. For the radiated coupling, shielding technologies are needed for suppressing electromagnetic interference. Because existing electromagnetic spectrum has become increasingly dense, electromagnetic power density in a unit volume has dramatically increased, and a large number of high-level and low-level devices or equipment are used in a mixed manner. Correspondingly, electromagnetic environments of devices and systems deteriorate gradually. The importance of electromagnetic shielding becomes more prominent.

An existing electromagnetic shielding solution includes providing a magnetic field shielding layer on a semiconductor packaging structure to shield the electromagnetic interference between chips. There is a need to provide a packaging structure with improved electromagnetic shielding performance.

SUMMARY

One aspect of the present disclosure provides a fabrication method for forming a packaging structure. The method includes: providing semiconductor chips, each of which includes a functional surface and a non-functional surface opposite to the functional surface; providing soldering pads on functional surfaces of the semiconductor chips, and a metal bump on each soldering pad; providing a base plate, wiring structures in the base plate, input terminals on a front surface of the base plate, and output terminals on a back surface of the base plate, where the input terminals and the output terminals are connected to corresponding wiring structures respectively; mounting the semiconductor chips on the front surface of the base plate inversely, such that each metal bump on each semiconductor chip is connected to a corresponding input terminal on the front surface of the base plate; forming a bottom filling layer between a functional surface of each semiconductor chip and the front surface of the base plate; forming a first shielding layer covering a non-functional surface and sidewalls of each semiconductor chip, and covering sidewalls of a corresponding bottom filling layer; forming a second shielding layer on each first shielding layer; forming a plastic encapsulation layer on second shielding layers and on a portion of the base plate between semiconductor chips; and forming external contact structures on the back surface of the base plate and connected to the output terminals.

Another aspect of the present disclosure provides a packaging structure. The packaging structure includes: a base plate, wiring structures in the base plate, input terminals on a front surface of the base plate, and output terminals on a back surface of the base plate, where the input terminals and the output terminals are connected to corresponding wiring structures respectively; semiconductor chips mounted on the front surface of the base plate inversely, each of which includes a functional surface, and a non-functional surface opposite to the functional surface, soldering pads on the functional surface, and a metal bump on each soldering pad and connected to a corresponding input terminal on the front surface of the base plate; a bottom filling layer between a functional surface of each semiconductor chip and the front surface of the base plate; a first shielding layer surrounding the non-functional surface and sidewalls of each semiconductor chip and a corresponding bottom filling layer; a second shielding layer on each first shielding layer; and external contact structures connected to the output terminals on the back surface of the base plate.

Another aspect of the present disclosure provides an discrete packaging structure formed by cutting a packaging structure. The discrete packaging structure includes: a base plate, wiring structures in the base plate, input terminals on a front surface of the base plate, and output terminals on a back surface of the base plate, where the input terminals and the output terminals are connected to corresponding wiring structures respectively; a semiconductor chip mounted on the front surface of the base plate inversely, including a functional surface, a non-functional surface opposite to the functional surface, soldering pads on the functional surface, and a metal bump on each soldering pad and connected to a corresponding input terminal on the front surface of the base plate; a bottom filling layer between the functional surface of the semiconductor chip and the front surface of the base plate; a first shielding layer surrounding the non-functional surface and sidewalls of the semiconductor chip and a corresponding bottom filling layer; a second shielding layer on the first shielding layer; and external contact structures connected to the output terminals and on the back surface of the base plate.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
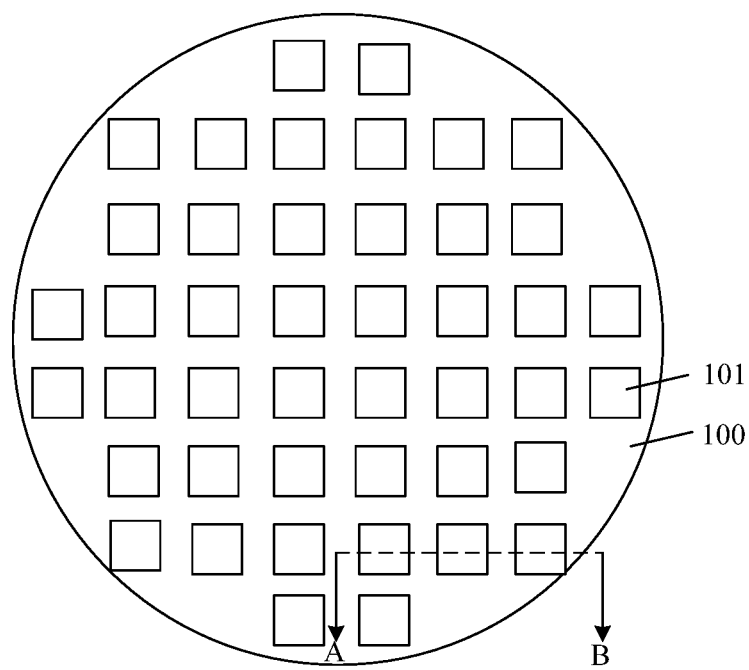
FIGS. 1-12 illustrate structures corresponding to certain stages in an exemplary fabrication method for forming a packaging structure according to various disclosed embodiments of the present disclosure.

Reference will now be made in detail to exemplary embodiments of the disclosure, which are illustrated in the accompanying drawings. Wherever possible, the same reference numbers will be used throughout the drawings to refer to the same or like parts. For description purposes only, the embodiments below are used as examples to illustrate the present disclosure, and should not limit the scopes of the present disclosure.

In the description of the present application, it should be understood that the terms "first" and "second" are used for description purposes only, and cannot be understood as indicating or implying relative importance or implicitly indicating the number of technical features indicated. Thus, the features defined as "first" and "second" may explicitly or implicitly include one or more of the features. In the description of this application, the meaning of "plurality" is two or more, unless otherwise specifically limited.

There are needs to improve electromagnetic shielding performance.

In the existing technologies, a magnetic field shielding layer is usually formed by a sputtering process. A semiconductor packaging structure usually has a large thickness and a rectangular shape. Correspondingly, the semiconductor packaging structure usually has multiple apex angles and steep sidewalls. When forming the magnetic field shielding layer to cover the semiconductor packaging structure by the sputtering process, a thickness of the formed magnetic field shielding layer may be inhomogeneous and edges of the semiconductor packaging structure may not be covered. It may be difficult to guarantee the shielding performance of the magnetic field shielding layer.

The present disclosure provides a packaging structure and its fabrication method to at least partially alleviate the above problems. The fabrication method may include: mounting semiconductor chips inversely to a front surface of a base plate and forming a bottom filling layer between the front surface of the base plate and a functional surface of each semiconductor chips; forming a first shielding layer covering a non-functional surface and sidewalls of each semiconductor chips and sidewalls of a corresponding bottom filling layer; forming a second shielding layer on each first shielding layer; forming a plastic encapsulation layer on second shielding layer and on a portion of the base plate between the semiconductor chips; and forming external contact structures on a back surface of the base plate and connected to output terminals. By forming the second shielding layer on the first shielding layer, the second shielding layer may cover a portion of the first shielding layer with an uneven thickness and poor edge coverage, thereby making an overall shield layer formed by the first shielding layer and the second shielding layer complete, to improve shielding performance.

One embodiment of the present disclosure provides a fabrication method for forming a packaging structure, as illustrated in FIGS. 1-12.

Figure 2:

As illustrated in FIGS. 1-4 where FIG. 2 is a cross-section view along an AB direction in FIG. 1, semiconductor chips 101 may be provided. Each semiconductor chip 101 may include a functional surface and a non-functional surface opposite to the functional surface. Soldering pads 102 may be disposed on the functional surface and a metal bump 103 may be formed on each soldering pad 102, in each semiconductor chip 101.

In each semiconductor chip, integrated circuits (not shown in the figures) may be formed on the functional surface, and the soldering pads 102 may be disposed on the functional surface. The soldering pads 102 may be electrically connected to the integrated circuits in the semiconductor chip 101 and may be used as terminals for electrically connecting the integrated circuits in the semiconductor chip 101 to external circuits.

In each semiconductor chip 101, the functional surface may be a surface for forming the integrated circuits and the non-functional surface may be a surface opposite to the functional surface, while surrounding surfaces between the functional surface and the non-functional surface may be sidewalls of the semiconductor chip 101.

Figure 3:
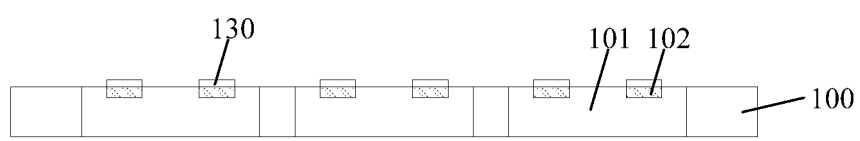
Figure 4:
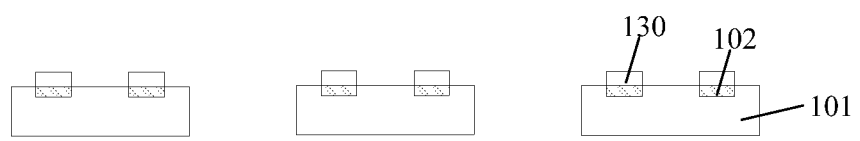

The semiconductor chips 101 may be formed by a semiconductor integration manufacturing process. As illustrated in FIGS. 1-2, a wafer 100 may be provided. The wafer 100 may include chip areas arranged in rows and columns, and cutting path areas between the chip areas. The semiconductor chips 101 may be formed correspondingly in the chip areas of the wafer 100. The soldering pads 102 may be formed on the functional surface of each of the semiconductor chips 101. As illustrated in FIG. 3, a metal bump 130 may be formed on each of the soldering pads 102 on the functional surface of each of the semiconductor chips 101. Metal bumps 103 may be made of aluminum, nickel, tin, tungsten, platinum, copper, titanium, chromium, tantalum, gold, silver, or a combination thereof. The metal bumps 103 may be formed by an electrical plating process, a sputtering process, or a physical vapor deposition process. Each metal bump 103 may raise a corresponding one of the soldering pads 102 to facilitate subsequently wiring, and may also protect the corresponding one of the soldering pads 102 and conduct heat. As illustrated in FIG. 4, the wafer 100 may be cut along the cutting path to form the discrete semiconductor chips 101.

In one embodiment, the wafer 100 may be made of a material including single-crystalline silicon, single-crystalline germanium, GeSi, SiC, silicon on an insulator (SOI), germanium on an insulator (GOI), or other materials including III-V compounds such as GaAs.

In one embodiment, integrated circuits in the semiconductor chips 101 may include semiconductor devices (such as transistors, memories, or diodes) and/or interconnection structures connecting the semiconductor devices (such as metal wires or metal plugs).

In one embodiment, the semiconductor chips 101 may be semiconductor chips requiring electromagnetic shielding.

Figure 5:
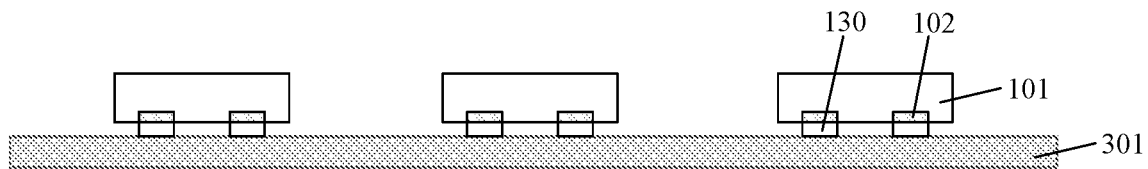

As illustrated in FIG. 5, a base plate 301 may be provided.

The base plate 301 may have wiring structures. Input terminals may be disposed on a front side of the base plate 301, and output terminals may be disposed on a backside of the carrier plate 301. The input terminals and the output terminals may be connected to the corresponding wiring structures. The semiconductor chips 101 may be mounted on the front side of the carrier plate 301 inversely, and each metal bump 130 on each semiconductor chip 101 may be connected to a corresponding input terminal on the front side of the base plate 301.

The base plate 301 may be a PCB board or a wire carrier board. The base plate 301 may include the wiring structures. The wiring structures may be disposed in the base plate 301 by rows and columns. Each wiring structure may be connected to a corresponding input terminal or a corresponding output terminal. Subsequently, an integration packaging of the base plate 301 with the semiconductor chips with a first shielding layer and a second shielding layer may be achieved.

When mounting the semiconductor chips 101 on the front side of the carrier plate 301 inversely, each metal bump 130 on each semiconductor chip 101 may be connected to a corresponding input terminal on the front side of the base plate 301 by a solder layer.

The solder layer may be made of tin, SnAg, SnPb, SnAgCu, SnAgZn, SnZn, SnBiIn, SnIn, SnAu, SnCu, SnZnIn, SnAgSb, or a combination thereof.

In one embodiment, the method may further include providing conductive contact structures in the base plate 301 (not shown in the figures). The conductive contact structures may be connected to the subsequently formed first shielding layer, and correspondingly the first shielding layer may discharge or prevent static interference from outside through a rewiring layer 123.

Figure 6:
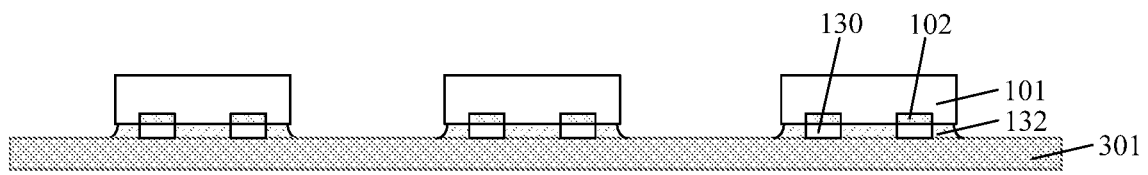

As illustrated in FIG. 6, a bottom filling layer 132 may be formed between a functional surface of each semiconductor chip 101 and the front side of the base plate 301.

In each semiconductor chip 101, the bottom filling layer 132 may cover sides of the metal bumps 130.

The bottom filling layer 132 may be formed by an injection molding or transfer molding process. The bottom filling layer 132 may be made of a resin, and the resin may include epoxy resin, polyimide resin, benzocyclobutene resin, polybenzoxazole resin, or a combination thereof.

Figure 7:
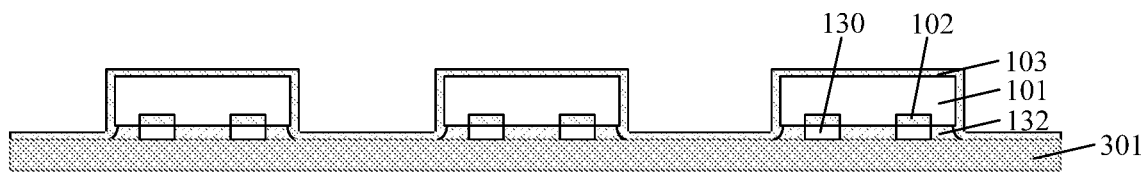

As illustrated in FIG. 7, a first shielding layer 103 may be formed to cover a non-functional surface and sidewalls of each semiconductor chip 101 and sides of a corresponding bottom filling layer 132.

In one embodiment, each first shielding layer 103 may cover a non-functional surface and sidewalls of a corresponding semiconductor chip 101 and sides of a corresponding bottom filling layer 132, and may also cover a portion of the base plate 301 between the semiconductor chips 101. In some other embodiments, each first shielding layer 103 may only cover a non-functional surface and sidewalls of a corresponding semiconductor chip 101 and sides of a corresponding bottom filling layer 132.

In one embodiment, the first shielding layer may be formed by a sputtering process, and may be made of a material including copper, tungsten, or aluminum. Since each of the semiconductor chips 101 may have four apex angles (at right angles), a large thickness, and steep sidewalls (angles between the sidewalls and the surface of the base plate 301 may be 90 degrees), the first shielding layer 103 formed by the sputtering process may have problems of uneven thickness and poor edge coverage.

In one embodiment, the formed first shielding layer 103 may be a shielding layer for electric field and magnetic field, and may be used for shielding the electric field and the magnetic field. The second shielding layer formed subsequently may also be an electric field shielding layer and the magnetic field, and may be used for shielding the electric field and the magnetic field.

A shielding layer may be needed to shielding the electric field and the magnetic field. An existing single-layer shielding layer with a specific material or an existing shielding layer including multilayer same or similar materials may only have a good shielding effect for the electric field, and have a weak shielding effect for the magnetic field. The shielding performance may be poor. In some other embodiments, the first shielding layer 103 may be a magnetic field shielding layer, and may be used for shielding the magnetic field. The second shielding layer formed subsequently may be an electric field shielding layer, and may be used for shielding the electric field. In some other embodiments, the first shielding layer 103 may be an electric field shielding layer, and may be used for shielding the electric field. The second shielding layer formed subsequently may be a magnetic field shielding layer, and may be used for shielding the magnetic field. By forming the first shielding layer and the second shielding layer with the above structure, the first shielding layer and the second shielding layer may shield the electric field and the magnetic field respectively, and the shielding performance of the shielding layer may be improved. When the first shielding layer 103 is the electric field shielding layer, the first shield layer 103 (the electric field shielding layer) may be made of a material including copper, tungsten, or aluminum. When the first shielding layer 103 is a magnetic field shielding layer, the first shield layer 103 (the magnetic field shielding layer) may be made of a material including CoFeB alloy, CoFeTa, NiFe, Co, CoFe, CoPt, or Ni—Co—Fe alloy. The first shielding layer 103 may be formed by a sputtering process, a physical vapor deposition process, an atomic layer deposition process, a chemical vapor deposition process, or any other suitable processes.

Figure 8:
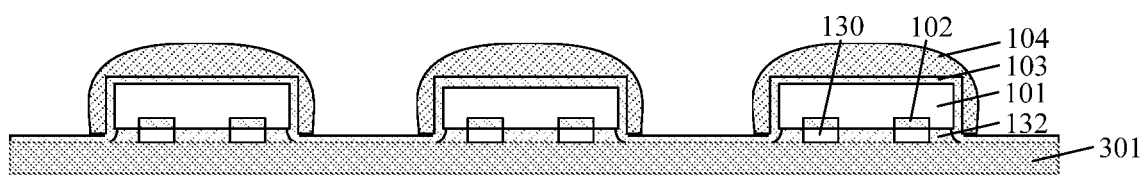

As illustrated in FIG. 8, a second shielding layer 104 may be formed on each first shielding layer 103.

By forming a second shielding layer 104 on each first shielding layer 103, the second shielding layer 104 may cover a portion of the first shielding layer 103 with the uneven thickness and poor edge coverage. Correspondingly, the overall shielding layer constituted by the first shielding layer 103 and the second shielding layer 104 may be complete, improving the shielding performance.

In one embodiment, each second shielding layer 104 may be only located on a portion of the surface of the first shielding layer 103 on the non-functional surfaces and the sidewalls of a corresponding semiconductor chip 101. A surface of the second shielding layer 104 may be ellipsoidal. The second shielding layer 104 may be formed by a selective plating process, a dispensing process or a mesh printing process, so that the formed second shielding layer 104 can better cover the first shielding layer and prevent the second shielding layer 104 from forming areas with poor coverage. Correspondingly, the integrity of the overall shield layer formed by both the first shield layer 103 and the second shield layer 104 may be further ensured, and the subsequent removal of the semiconductor chips may not need additional masking and etching processes.

In one embodiment, the second shielding layer 104 may be made of a material including copper, solder, or conductive silver paste. In one embodiment, the second shielding layer 104 may be formed by: forming a mask layer (not shown in the figures) on the base plate 301 where the mask layer includes openings exposing the portion of the first shielding layer 103 on the non-functional surfaces and the sidewalls of the semiconductor chips 101; forming the second shielding layer 104 in the openings by using the first shielding layer as a conductive layer in the plating process to electroplate, or brushing the solder into the openings to form the second shielding layer 104 directly; and removing the mask layer.

In another embodiment, the second shielding layer 104 may be made of solder or conductive silver paste, and may be formed by the dispensing process or the mesh printing process correspondingly. When performing the dispensing process, the solder or the conductive silver paste may be applied on a surface of the portion of each first shielding layer 103 on the non-functional surface and the sidewalls of a corresponding semiconductor chip 101. When performing the mesh printing process, a portion of the first shielding layer 103 on a portion of the base plate 301 around the semiconductor chip 101 may be removed, and correspondingly a remaining portion of the first shielding layer 103 may cover the non-functional surfaces and the sidewalls of the corresponding semiconductor chip 101, and the side surfaces of the corresponding bottom filling layer. The remaining portion of the first shielding layer 103 may further extend to partially cover the surface of a portion of the base plate 301 around the corresponding semiconductor chip 101. Then a mesh plate with meshes may be placed on the base plate 301 and each of the semiconductor chips may be placed in a correspondingly mesh in the mesh plate. Subsequently, the solder may be brushed into the meshes and the solder may cover the surface of the portion of the first shielding layer 103 on the non-functional surfaces and the sidewalls of the corresponding semiconductor chip 101. Then the mesh plate may be removed and the solder may be reflowed to form the second shielding layer 104 on each first shielding layer 103.

In one embodiment, the solder may be a metal including tin, tin-silver, tin-lead, tin-silver copper, tin silver-zinc, tin zinc, tin bismuth indium, tin indium, tin gold, tin copper, tin zinc indium, tin-silver antimony, or a combination thereof.

In some other embodiments, the first shielding layer 103 may be a magnetic field shielding layer, and the second shielding layer 104 may be an electric field shielding layer. In some other embodiments, the first shielding layer 103 may be an electric field shielding layer, and may be used for shielding the electric field. The second shielding layer 104 may be a magnetic field shielding layer, and may be used for shielding the magnetic field. By forming the first shielding layer and the second shielding layer with the above structure, the first shielding layer and the second shielding layer may shield the electric field and the magnetic field respectively, and the shielding performance of the shielding layer may be improved. When the second shielding layer 104 is the electric field shielding layer, the second shielding layer 104 (the electric field shielding layer) may be made of a material including copper, tungsten, or aluminum. When the second shielding layer 104 is a magnetic field shielding layer, the second shielding layer 104 (the magnetic field shielding layer) may be made of a material including CoFeB alloy, CoFeTa, NiFe, Co, CoFe, CoPt, or Ni—Co—Fe alloy. The second shielding layer 104 may be formed by a sputtering process, a physical vapor deposition process, an atomic layer deposition process, a chemical vapor deposition process, or any other suitable processes.

In one embodiment, after forming the second shielding layer 104, a portion of each first shielding layer 103 on the portion of the base plate between the semiconductor chips 101 may be removed by etching.

Figure 9:
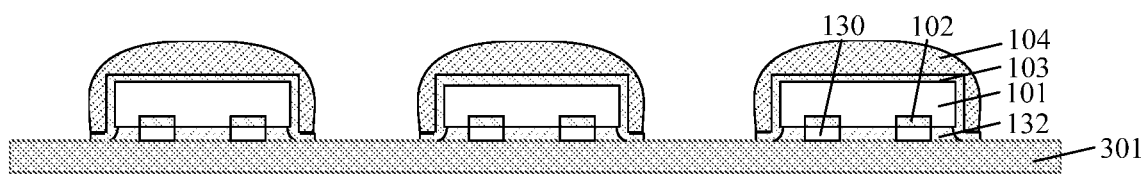

As illustrated in FIG. 9, a portion of each first shielding layer 103 on the portion of the base plate between the semiconductor chips 101 may be removed.

In one embodiment, a portion of each first shielding layer 103 on the portion of the base plate between the semiconductor chips 101 may be removed by a dry etch process including a plasma etch process.

Figure 10:
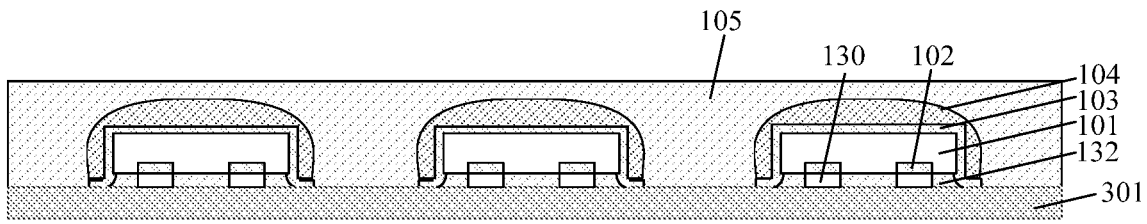

As illustrated in FIG. 10, a plastic encapsulation layer 105 may be formed on the second shielding layers 104 and on the portion of the base plate 301 between the semiconductor chips 101.

The plastic encapsulation layer 105 may be used to seal and fix the semiconductor chips, for forming a pre-packaging plate subsequently.

The plastic encapsulation layer 105 may be made of a material including epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer, polyvinyl alcohol, or a combination thereof.

The plastic encapsulation layer 105 may be formed by an injection molding process, a transfer molding process, or any other suitable processes.

Figure 11:
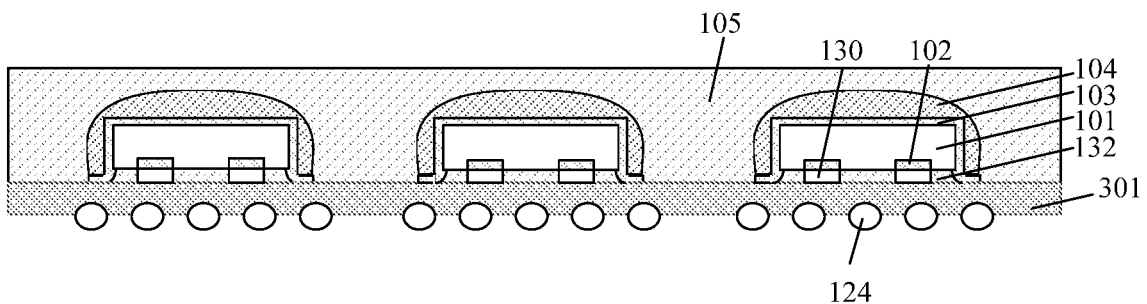

As illustrated in FIG. 11, external contact structures 124 may be formed on the backside of the base plate 301 and connected to the output terminals, to form a pre-packaging plate 10.

In one embodiment, each external contact structure 124 may be a soldering ball. In other embodiments, each external contact structure 124 may include a metal post and a soldering ball on the metal post.

Figure 12:
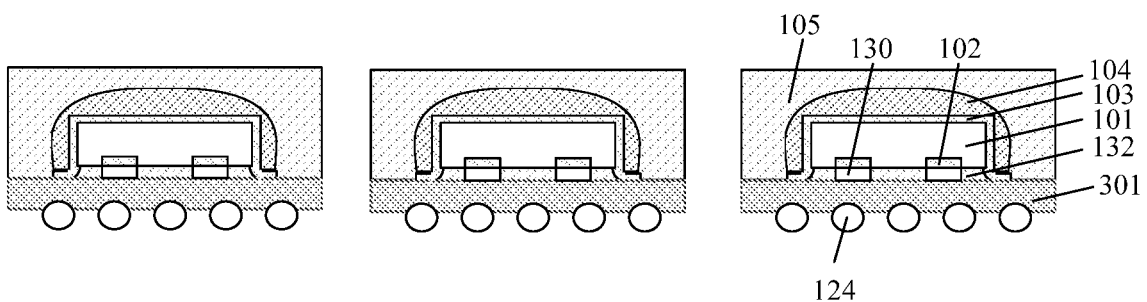

As illustrated in FIGS. 11-12, after forming the external contact structure 124, the packaging plate 10 may be cut to form discrete packaging structure 11.

The present disclosure also provides a packaging structure 11. As illustrated in FIG. 12, each packaging structure 11 may include a base plate 301, wiring structures in the base plate 301, a semiconductor chip 101 mounted on a front side of the base plate 301 inversely, a bottom filling layer 132, a first shielding layer 103, a second shielding layer 104, and external contact structures 124.

Input terminals may be disposed on a front side of the base plate 301, and output terminals may be disposed on a backside of the base plate 301. The input terminals and the output terminals may be connected to the wiring structures respectively.

The semiconductor chip 101 may include a functional surface and a non-functional surface opposite to the functional surface.

Soldering pads 102 may be disposed on the functional surface and a metal bump 103 may be formed on each soldering pad 102, in the semiconductor chip 101. Each metal bump 130 on the semiconductor chip 101 may be connected to a corresponding input terminal on the front side of the base plate 301.

The bottom filling layer 132 may be disposed between the functional surface of the semiconductor chip 101 and the front side of the base plate 301.

The first shielding layer 103 may cover the non-functional surface and the sidewalls of the semiconductor chip 101 and sides of the bottom filling layer 132.

The second shielding layer 104 may be disposed on the first shielding layer 103.

In the present disclosure, a massive fabrication of the packaging structure 11 with the first shielding layer 103 and the second shielding layer 014 may be achieved by the above semiconductor integration and fabrication processes. The fabrication efficiency may be improved.

The present disclosure also provides another fabrication method for forming a packaging structure. FIGS. 13-18 illustrate semiconductor structures corresponding to different stages in the fabrication method for forming a packaging structure. In comparison to the previous fabrication method, in the present method, a bottom shielding layer may be formed on the functional surface of the semiconductor chip. The bottom shielding layer may completely cover the functional surface of the semiconductor chip, and have surrounding edges flush with surrounding sidewalls of the semiconductor chip. The soldering pads may penetrate through the bottom shielding layer, and may be separated from the bottom shielding layer through isolation layers. When forming the first shielding layer, the first shielding layer may be connected to the surrounding edges of the bottom shielding layer. In the present method, the second shielding layer may be formed on the first shielding layer after forming the first shielding layer. By forming the second shielding layer on the first shielding layer, the second shielding layer may cover areas of the first shielding layer with an uneven thickness and poor edge coverage, thereby making an overall shield layer formed by the first shielding layer and the second shielding layer complete, to improve shielding performance. Further, the bottom shielding layer may be formed on the functional surface of the semiconductor chip, and when forming the first shielding layer, the first shielding layer may be connected to the surrounding edges of the bottom shielding layer. The semiconductor chip in the packaging structure may be completely or comprehensively covered by the bottom shielding layer and the first shielding layer. Correspondingly, the electric and magnetic field may not enter the packaging structure from a bottom of the packaging structure to induce the electromagnetic interference for the semiconductor chip. Then a completely electromagnetic shielding for the semiconductor chips may be achieved, further improving the electromagnetic shielding performance.

Figure 13:
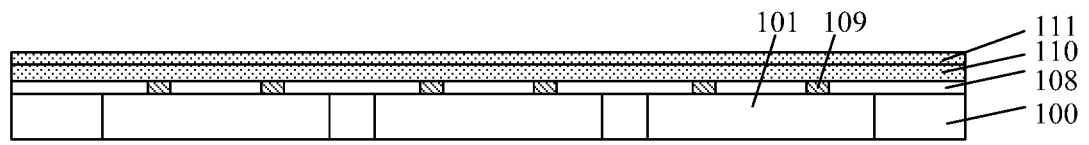
FIGS. 13-18 illustrate structures corresponding to certain stages in an exemplary fabrication method for forming a packaging structure according to various disclosed embodiments of the present disclosure.

Semiconductor chips with the bottom shielding layer may be formed by the following processes. As illustrated in FIG. 13, semiconductor chips 101 on a wafer 100 may be provided. Each semiconductor chip 101 of the semiconductor chips 101 may include a top dielectric layer 108 and a top interconnection structure 109 in the top dielectric layer 108. The semiconductor chip 101 may further include semiconductor devices (such as transistors) formed on a surface of the wafer 100 (or on a semiconductor substrate), interlayer dielectric layers between the top dielectric layer 108 and the surface of the wafer 100. Each of the interlayer dielectric layers may include a corresponding interconnection structure. Interconnection structures in the interlayer dielectric layers may connect upper or lower layers, or electrically connected to the semiconductor devices. The top interconnection structure 109 in the top dielectric layer 108 may be electrically connected to an interconnection structure in an adjacent interlayer dielectric layer of the interlayer dielectric layers.

Subsequently, an isolation layer may be formed on each top dielectric layer 108.

In one embodiment, each isolation layer may have a multilayer structure, and may include a first isolation layer 110 and a second isolation layer 111 on the first isolation layer 110. The first isolation 110 and the second isolation layer 111 may be made of different materials. The first isolation 110 and the second isolation layer 111 may be made of one of SiO2, SiN, or SiNO respectively, to achieve precise control of depth of second openings formed subsequently. Correspondingly, when forming the second openings, an excessive etching of the isolation layer which may induce exposing of a portion of a surface of the top interconnection structure 109 on the top dielectric layer 108 by the second openings and short circuits between top interconnection structures 109 when forming the bottom shielding layer in the second openings, may be prevented.

In some other embodiments, each isolation layer may have a single-layer structure.

Figure 14:
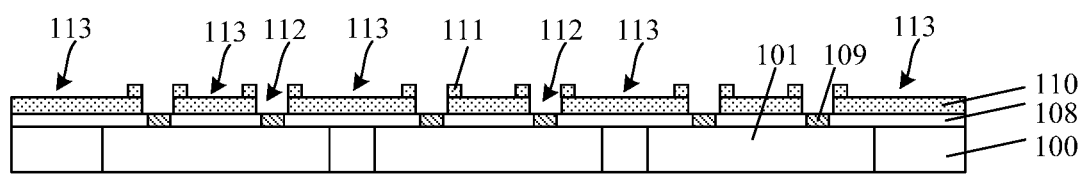

As illustrated in FIGS. 14, the isolation layers may be etched to form first openings 112 and second openings 113 surrounding the first openings 112. A remaining portion of the isolation layers may be only located between the first openings 112 and the second openings 113, to separate the first openings 112 from the second openings 113.

The first openings 112 may be discrete and penetrate through the isolation layers 111. Each first opening 112 may expose a portion of a surface of a corresponding interconnection structure 109. The first openings 112 may be filled with metal to form the soldering pads.

Each second opening 113 may surround a corresponding first opening 112, and may be separated from the corresponding first opening 112 through the isolation layers 111. Each second opening 113 may have a depth smaller than a thickness of the isolation layer. All areas outside the first openings 112 and the isolation layer 111 surrounding the first openings 112 may correspond to areas of the second openings 113. The second openings 113 may be connected. When forming the bottom shielding layer in the second openings 113, the bottom shielding layer may cover all areas of the functional surfaces of the semiconductor chips 101 except for the soldering pads (formed in the first openings 112) and the isolation layer surrounding the soldering pads. When forming the first shielding layer on the non-functional surfaces and the sidewalls of the semiconductor chips 101, the first shielding layer may be connected to the surrounding edges of the bottom shielding layer. One of the semiconductor chips in the packaging structure may be completely or comprehensively covered by the bottom shielding layer and the first shielding layer. Correspondingly, the electric and magnetic field may not enter the packaging structure from a bottom of the packaging structure to induce the electromagnetic interference for the semiconductor chips. Then a completely electromagnetic shielding for the semiconductor chips may be achieved, further improving the electromagnetic shielding performance.

In one embodiment, the second isolation layers 111 may be etched using a first etch process with the first isolation layers 110 as a stop layer, to form the second openings in the second isolation layers 111. Subsequently, the second isolation layers 111 and the first isolation layers 110 may be etched using a second etch process, to form the first openings in the second isolation layers 111 and the first isolation layers 110. Before the first and the second etch processes, a corresponding mask layer may be formed on the second isolation layers. In some other embodiment, the second etch process may be performed before the first etch process.

In some other embodiments, each isolation layer may have a single-layer structure, and the first openings and the second openings may be formed by two etch processes respectively. Depth of the second openings may be controlled by controlling the etch time of the etch process (the depth of the second openings may be smaller than the thickness of the isolation layers).

Figure 15:
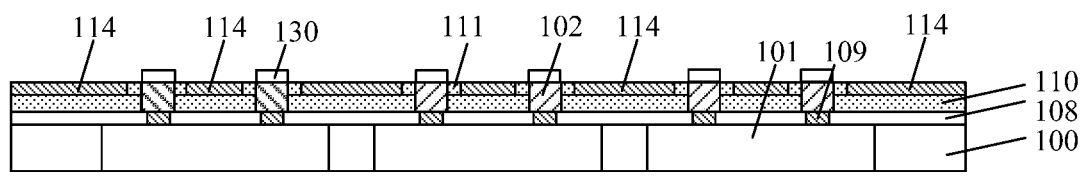
Figure 17:
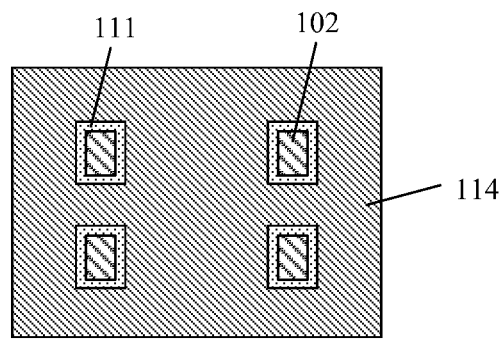

As illustrated in FIG. 15, a soldering pad 102 may be formed in each first opening by filling the first opening with metal, and the bottom shielding layer 114 may be formed in the second openings by filling the second openings with metal. A metal bump 130 may be formed on each soldering pad 102. A first encapsulation layer 132 may be formed covering metal bumps 130 and the bottom shielding layer 114. As illustrated in FIG. 17, after forming the first encapsulation layer 132, the wafer 100 may be cut to form the discrete semiconductor chips 101 with the bottom shielding layer 114.

In some embodiments, the soldering pads 102 and the bottom shielding layer 114 may be formed by a same process including: forming a metal material layer in the first openings, in the second openings, and on the isolation layers by a physical vapor deposition process, a sputtering process, or a plating process; planarizing the metal material layer to remove a portion of the metal material layer higher than the surfaces of the isolation layers and form a soldering pad in each first opening and the bottom shielding layer 114 in the second openings. The metal material layer may be made of a material including aluminum, nickel, tin, tungsten, platinum, copper, titanium, chromium, tantalum, gold, silver, or a combination thereof.

Figure 16:
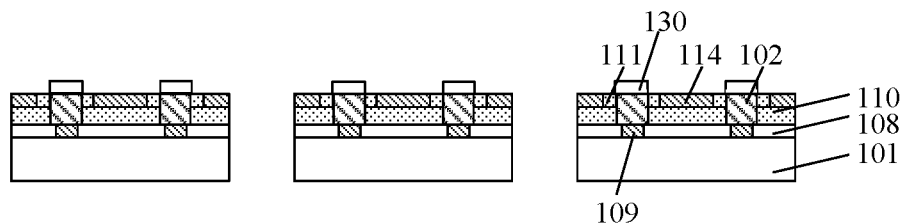

As illustrated in FIG. 17 which is a top view of the soldering pads 102 and the bottom shielding layer 104 in FIG. 16, each semiconductor chip 101 of the discrete semiconductor chip 101 may include the bottom shielding layer 114 on the functional surface, and the bottom shielding layer 114 may cover the whole functional surface of the semiconductor chip 101. The surrounding edges of the bottom shielding layer 114 may be flush with the surrounding sidewalls of the semiconductor chip 101. The soldering pads 102 may penetrate through the bottom shielding layer and may be isolated from the bottom shielding layer 114 by the isolation layers 111.

In the present embodiment, the process for forming the bottom shielding layer 114 may be integrated in the existing fabrication processes of the semiconductor chips, and may be performed synchronically with the process for forming the soldering pads 102. The fabrication process may be simplified, and the process difficulty may be reduced, to improve the efficiency.

Figure 18:
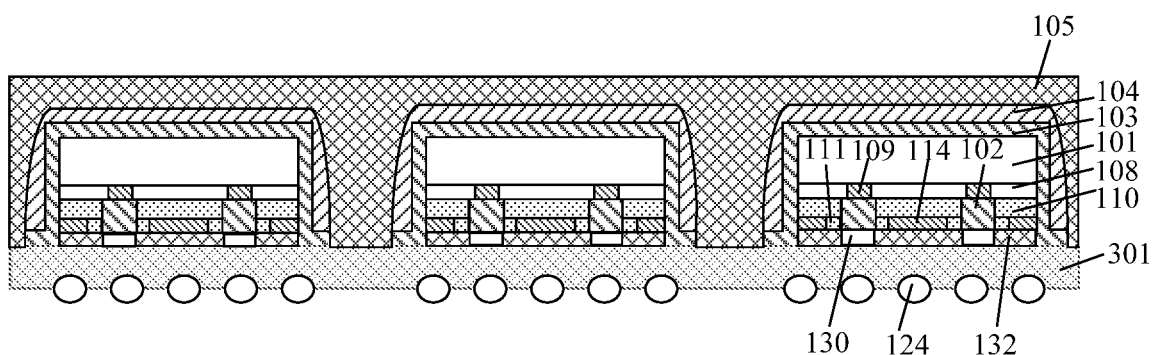

As illustrated in FIG. 18, the fabrication method may further include: mounting the semiconductor chips 114 with the bottom shielding layer 114 on the base plate 301 inversely, to make each metal bump 130 on each semiconductor chip 101 connected to a corresponding input terminal of the base plate 301; forming a bottom filling layer 132 between a functional surface of each semiconductor chip 101 and the front side of the base plate 301; forming a first shielding layer 132 covering a non-functional surface and sidewalls of each semiconductor chip 101 and sides of a corresponding bottom filling layer 132; forming a second shielding layer on each first shielding layer 103; forming a plastic encapsulation layer 105 on the second shielding layers 104 and on a portion of the base plate 301 between the semiconductor chips 101; and forming external contact structures 123 on a back side of the base plate 301 and connected to the output terminals.

The present disclosure also provides a packaging structure. As illustrated in FIG. 11 or FIG. 18, the packaging structure may include: a base plate 301, semiconductor chips 101, bottom filling layers 132, first shielding layers 103, second shielding layers 104, and external contact structures 124.

The base plate 301 may include wiring structures. Input terminals may be disposed on a front side of the base plate 301, and output terminals may be disposed on a backside of the carrier plate 301. The input terminals and the output terminals may be connected to the corresponding wiring structures. The semiconductor chips 101 may be mounted on the front side of the carrier plate 301 inversely, and each metal bump 130 on each semiconductor chip 101 may be connected to a corresponding input terminal on the front side of the base plate 301.

The semiconductor chips 101 may be mounted on the base plate 301 inversely. Each semiconductor chip 101 may include a functional surface and a non-functional surface opposite to the functional surface. Soldering pads 102 may be disposed on the functional surface and a metal bump 103 may be formed on each soldering pad 102, in each semiconductor chip 101. Each metal bump 130 on each semiconductor chip 101 may be connected to a corresponding input terminal on the front side of the base plate 301 by a solder layer.

Each bottom filling layer 132 may be formed between a functional surface of a corresponding semiconductor chip 101 and the front side of the base plate 301.

Each first shielding layer 103 may be formed to cover a non-functional surface and sidewalls of a corresponding semiconductor chip 101 and sides of a corresponding bottom filling layer 132.

Each second shielding layer 104 may be formed on a corresponding first shielding layer 103.

The external contact structures 124 may be formed on the backside of the base plate 301 and connected to the output terminals.

In one embodiment, the first shielding layers 103 may be formed by a sputtering process, and the second shielding layers 104 may be formed by a plating process, a dispensing process or a mesh printing process. The first shielding layers 103 may be made of a material including copper, tungsten, or aluminum, and the second shielding layers 104 may be made of a material including copper, solder, or conductive silver paste.

In some other embodiments, each first shielding layer 103 may be a magnetic field shielding layer, and each second shielding layer 104 may be an electric field shielding layer. In some other embodiments, each first shielding layer 103 may be an electric field shielding layer, and each second shielding layer 104 may be a magnetic field shielding layer. The electric field shielding layer may be made of a material including copper, tungsten, or aluminum. The magnetic field shielding layer may be made of a material including CoFeB alloy, CoFeTa, NiFe, Co, CoFe, CoPt, or Ni—Co—Fe alloy.

In some embodiments as illustrated in FIG. 18, each bottom shielding layer may be formed on a functional surface of a corresponding semiconductor chip 101. In each semiconductor chip 101, a corresponding bottom shielding layer 114 may cover the whole functional surface of the semiconductor chip 101, and may have surrounding edges flush with surrounding sidewalls of the semiconductor chip 101. The soldering pads 102 may penetrate through the bottom filling layers 114, and may be isolated from the bottom filling layers 114 through isolation layers 111. The first shielding layers 103 may be connected to surrounding edges of the bottom shielding layers 114.

Each external contact structure 124 may include a soldering ball, or a metal post and a soldering ball on the metal post.

In another embodiment, the packaging structure may further include conductive contact structure in the base plate 301 and electrically connected to the first shielding layers 103.

The present disclosure also provides another fabrication method for forming a packaging structure. FIGS. 19-30 illustrate structures corresponding to certain stages in the fabrication method for forming a packaging structure.

Figure 19:
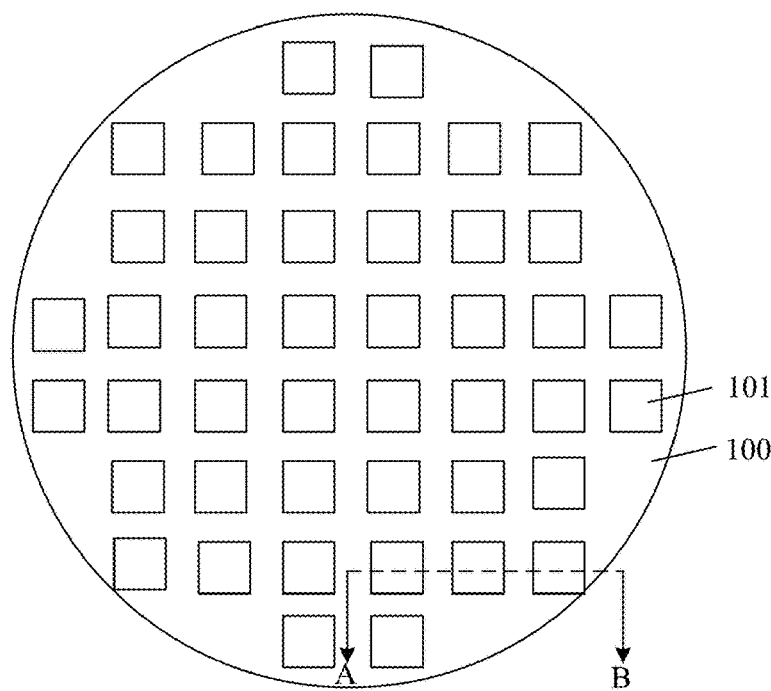
FIGS. 19-30 illustrate structures corresponding to certain stages in an exemplary fabrication method for forming a packaging structure according to various disclosed embodiments of the present disclosure.
Figure 20:
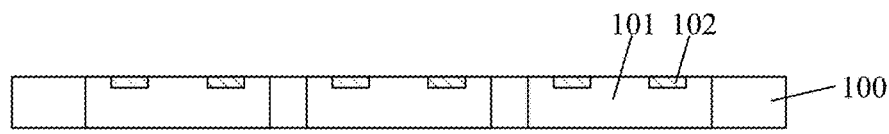

As illustrated in FIGS. 19-22 where FIG. 20 is a cross-section view along an AB direction in FIG. 1. Semiconductor chips 101 may be provided. Each semiconductor chip 101 may include a functional surface and a non-functional surface opposite to the functional surface. Soldering pads 102 may be disposed on the functional surface and a metal bump 103 may be formed on each soldering pad 102, in each semiconductor chip 101.

In each semiconductor chip 101, integrated circuits (not shown in the figures) may be formed in the functional surface, and the soldering pads 102 may be disposed on the functional surface. The soldering pads 102 may be electrically connected to the integrated circuits in the semiconductor chip 101 and may be used as terminals for electrically connecting the integrated circuits in the semiconductor chip 101 to external circuits.

In each semiconductor chip 101, the functional surface may be a surface for forming the integrated circuits and the non-functional surface may be a surface opposite to the functional surface, while surrounding surfaces between the functional surface and the non-functional surface may be sidewalls of the semiconductor chip 101.

Figure 21:
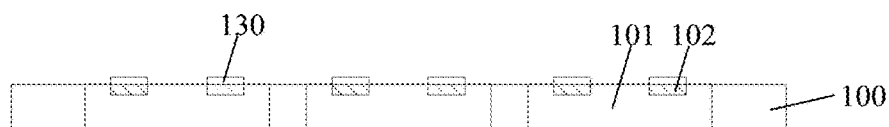
Figure 22:
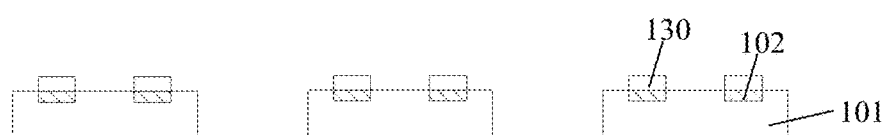

The semiconductor chips 101 may be formed by a semiconductor integration manufacturing process. As illustrated in FIGS. 19-20, a wafer 100 may be provided. The wafer 100 may include chip areas arranged in rows and columns, and cutting path areas between the chip areas. The semiconductor chips 101 may be formed correspondingly in the chip areas of the wafer 100. The soldering pads 102 may be formed on the functional surface of each of the semiconductor chips 101. As illustrated in FIG. 21, a metal bump 130 may be formed on each of the soldering pads 102 on the functional surface of each of the semiconductor chips 101. Metal bumps 103 may be made of aluminum, nickel, tin, tungsten, platinum, copper, titanium, chromium, tantalum, gold, silver, or a combination thereof. The metal bumps 103 may be formed by an electrical plating process, a sputtering process, or a physical vapor deposition process. Each metal bump 103 may raise a corresponding one of the soldering pads 102 to facilitate subsequently wiring, and may also protect the corresponding one of the soldering pads 102 and conduct heat. As illustrated in FIG. 22, the wafer 100 may be cut along the cutting path to form the discrete semiconductor chips 101.

In one embodiment, the wafer 100 may be made of a material including single-crystalline silicon, single-crystalline germanium, GeSi, SiC, silicon on an insulator (SOI), germanium on an insulator (GOI), or other materials including III-V compounds such as GaAs.

In one embodiment, integrated circuits in the semiconductor chips 101 may include semiconductor devices (such as transistors, memories, or diodes) and/or interconnection structures connecting the semiconductor devices (such as metal wires or metal plugs).

In one embodiment, the semiconductor chips 101 may be semiconductor chips requiring electromagnetic shielding.

Figure 23:
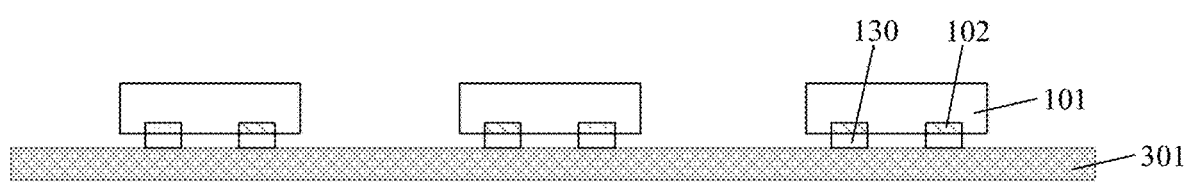

As illustrated in FIG. 23, a base plate 301 may be provided.

The base plate 301 may have wiring structures. Input terminals may be disposed on a front side of the base plate 301, and output terminals may be disposed on a backside of the carrier plate 301. The input terminals and the output terminals may be connected to the corresponding wiring structures. The semiconductor chips 101 may be mounted on the front side of the carrier plate 301 inversely, and each metal bump 130 on each semiconductor chip 101 may be connected to a corresponding input terminal on the front side of the base plate 301.

The base plate 301 may be a PCB board or a wire carrier board. The base plate 301 may include the wiring structures. The wiring structures may be disposed in the base plate 301 by rows and columns. Each wiring structure may be connected to a corresponding input terminal or a corresponding output terminal. Subsequently, an integration packaging of the base plate 301 with the semiconductor chips with a first shielding layer and a second shielding layer may be achieved.

When mounting the semiconductor chips 101 on the front side of the carrier plate 301 inversely, each metal bump 130 on each semiconductor chip 101 may be connected to a corresponding input terminal on the front side of the base plate 301 by a solder layer.

The solder layer may be made of tin, SnAg, SnPb, SnAgCu, SnAgZn, SnZn, SnBiIn, SnIn, SnAu, SnCu, SnZnIn, SnAgSb, or a combination thereof.

In one embodiment, the method may further include providing conductive contact structures in the base plate 301 (not shown in the figures). The conductive contact structures may be connected to the subsequently formed first shielding layer, and correspondingly the first shielding layer may discharge or prevent static interference from outside through a rewiring layer 123.

Figure 24:
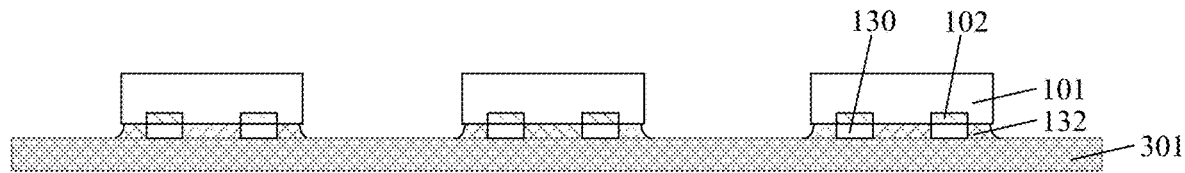

As illustrated in FIG. 24, a bottom filling layer 132 may be formed between a functional surface of each semiconductor chip 101 and the front side of the base plate 301.

In each semiconductor chip 101, the bottom filling layer 132 may cover sides of the metal bumps 130.

The bottom filling layer 132 may be formed by an injection molding or transfer molding process. The bottom filling layer 132 may be made of a resin, and the resin may include epoxy resin, polyimide resin, benzocyclobutene resin, polybenzoxazole resin, or a combination thereof.

Figure 25:
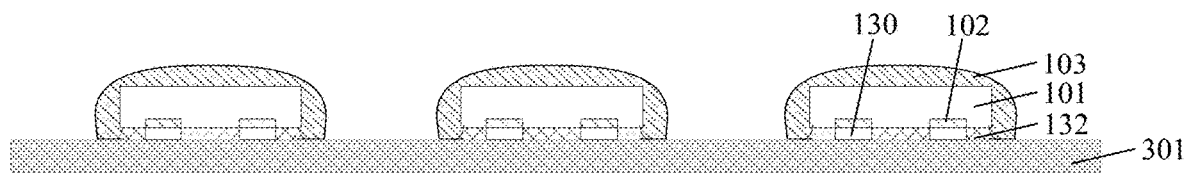

As illustrated in FIG. 25, a first shielding layer 103 with an ellipsoidal surface may be formed to cover a non-functional surface and sidewalls of each semiconductor chip 101 and sides of a corresponding bottom filling layer 132.

In one embodiment, each first shielding layer 103 may cover a non-functional surface and sidewalls of a corresponding semiconductor chip 101 and sides of a corresponding bottom filling layer 132.

The first shielding layer may be formed by a dispensing process or a mesh printing process directly on the non-functional surface and sidewalls of the corresponding semiconductor chip 101, and may not cover a portion of the base plate between semiconductor chips 101. The first shielding layer may evenly and completely cover the non-functional surface and sidewalls of the corresponding semiconductor chip 101. In one embodiment, the first shielding layer 103 may be made of a material including solder or conductive silver paste, and the dispensing process may be used to dispense the solder or conductive silver paste on the non-functional surface and the sidewalls of the corresponding semiconductor chip 101 to form the first shielding layer 103 with the ellipsoid surface. In another embodiment, a solder layer may be formed on the non-functional surface and the sidewalls of the corresponding semiconductor chip 101 by the mesh printing process, and then the first shielding layer 103 with the ellipsoid surface may be formed by a re-flowing process. The solder may be a metal including tin, tin-silver, tin-lead, tin-silver copper, tin silver-zinc, tin zinc, tin bismuth indium, tin indium, tin gold, tin copper, tin zinc indium, tin-silver antimony, or a combination thereof.

That the surface of the first shielding layer 103 may be ellipsoidal may means that the surface of the first shielding layer 103 may have no sharp corners. The surface of the first shielding layer 103 may be arc-shaped. Correspondingly, the first shielding layer 103 with the ellipsoidal surface may evenly and completely cover the non-functional surfaces and the sidewalls of the semiconductor chips 101. Further, when forming a second shielding layer on the ellipsoidal surface of the first shielding layer 103, a problem that the second shielding layer has uneven thickness and poor edge coverage may be avoided. An overall shielding layer formed by the first shielding layer and the second shielding layer may be complete, and the shielding performance may be improved.

In some embodiments, an intermediate material layer (not shown in the figures) may be formed on the non-functional surface and the sidewall of each semiconductor chip 101. The intermediate material layer may have an ellipsoidal surface. The first shielding layer 103 may be formed on a corresponding intermediate material layer subsequently and the surface of the first shielding layer 103 may be ellipsoidal. By forming the intermediate material layer, the first shielding layer with different materials may be formed on the intermediate material layer by different processes, and the surface of the first shielding layer 103 may be ellipsoidal. Further, when forming the first shielding layer on the ellipsoidal surface of the intermediate material layer, the first shielding layer may not be affected by the sharp corners or steep sidewalls. Correspondingly, a problem that the second shielding layer has uneven thickness and poor edge coverage in the first shielding layer may be avoided. The integrity of the shielding layer may be improved.

In some embodiments, the intermediate material layer may be made of a material including non-conductive glue, conductive silver paste, fluid resin, or solder. The intermediate material layer may be formed by a dispensing process or a mesh printing process. The first shielding layer with the ellipsoidal surface may be formed by a sputtering process, a selective plating process, a dispensing process, or a mesh printing process. The first shielding layer may be made of a material including copper, tungsten, aluminum, solder, or conductive silver paste. The first shielding layer may also be made of a material of the magnetic field shielding layer and electric field shielding layer.

In some embodiments, the first shielding layer may also cover the portion of the base plate at sides of the corresponding semiconductor chip. After forming a second shielding layer, a portion of the first shielding layer on the portion of the base plate at sides of the corresponding semiconductor chip may be removed by etching.

In one embodiment, the formed first shielding layer 103 may be a shielding layer for electric field and magnetic field, and may be used for shielding the electric field and the magnetic field. The second shielding layer formed subsequently may also be an electric field shielding layer and the magnetic field, and may be used for shielding the electric field and the magnetic field.

A shielding layer may be needed to shield the electric field and the magnetic field. An existing single-layer shielding layer with a specific material or an existing shielding layer including multilayer same or similar materials may only have a good shielding effect for the electric field, and have a weak shielding effect for the magnetic field. The shielding performance may be poor. In some other embodiments, the first shielding layer 103 may be a magnetic field shielding layer, and may be used for shielding the magnetic field. The second shielding layer formed subsequently may be an electric field shielding layer, and may be used for shielding the electric field. In some other embodiments, the first shielding layer 103 may be an electric field shielding layer, and may be used for shielding the electric field. The second shielding layer formed subsequently may be a magnetic field shielding layer, and may be used for shielding the magnetic field. By forming the first shielding layer and the second shielding layer with the above structure, the first shielding layer and the second shielding layer may shield the electric field and the magnetic field respectively, and the shielding performance of the shielding layer may be improved. When the first shielding layer 103 is the electric field shielding layer, the first shield layer 103 (the electric field shielding layer) may be made of a material including copper, tungsten, or aluminum. When the first shielding layer 103 is a magnetic field shielding layer, the first shield layer 103 (the magnetic field shielding layer) may be made of a material including CoFeB alloy, CoFeTa, NiFe, Co, CoFe, CoPt, or Ni—Co—Fe alloy. The first shielding layer 103 may be formed by a sputtering process, a physical vapor deposition process, an atomic layer deposition process, a chemical vapor deposition process, or any other suitable processes.

Figure 26:
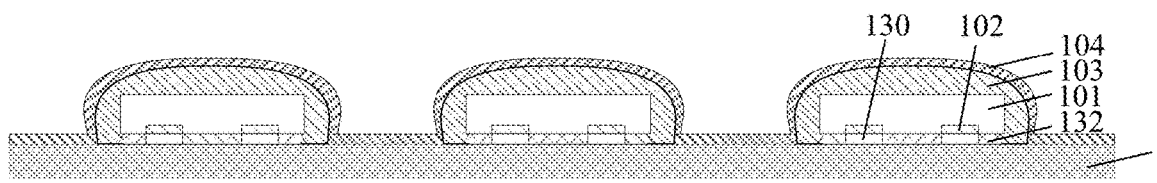

As illustrated in FIG. 26, a second shielding layer 104 may be formed on each first shielding layer 103.

In one embodiment, the second shielding layer 104 may be formed by a sputtering process, and may be made of a metal including copper, tungsten, or aluminum. The second shielding layer 104 may cover a corresponding first shielding layer 103 on the non-functional surface and sidewalls of a corresponding semiconductor chip 101, and also cover the portion of the base plate at sides of the corresponding semiconductor chip 101.

In other embodiments, the second shielding layer 104 may only cover the corresponding first shielding layer 103 on the non-functional surface and sidewalls of the corresponding semiconductor chip 101, and may have an ellipsoidal surface. The second shielding layer 104 may be formed by a selective plating process, a dispensing process or a mesh printing process, so that the formed second shielding layer 104 can better cover the corresponding first shielding layer and prevent the second shielding layer 104 from forming areas with poor coverage. Correspondingly, the integrity of the overall shield layer formed by both the first shield layer 103 and the second shield layer 104 may be further ensured, and the subsequent removal of the semiconductor chips may not need additional masking and etching processes.

In some embodiments, the second shielding layer 104 may be made of a material including copper, solder, or conductive silver paste. In one embodiment, the second shielding layer 104 may be made of copper, and may be formed by: forming a mask layer (not shown in the figures) on the base plate 301 where the mask layer includes openings where each opening exposes a portion of a corresponding first shielding layer 103 on the non-functional surfaces and the sidewalls of a corresponding semiconductor chip 101; forming a second shielding layer 104 in each opening by using the corresponding first shielding layer as a conductive layer in the plating process to electroplate; and removing the mask layer.

In another embodiment, the second shielding layer 104 may be made of solder or conductive silver paste, and may be formed by the dispensing process or the mesh printing process correspondingly. When performing the dispensing process, the solder or the conductive silver paste may be applied on a surface of the portion of the first shielding layer 103 on the non-functional surfaces and the sidewalls of a corresponding semiconductor chip 101. When performing the mesh printing process, a mesh plate with meshes may be placed on the base plate 301 and each of the semiconductor chips may be placed in a correspondingly mesh in the mesh plate. Subsequently, the solder may be brushed into the meshes and the solder may cover the surface of the portion of the first shielding layer 103 on the non-functional surfaces and the sidewalls of the corresponding semiconductor chip 101. Then the mesh plate may be removed and the solder may be reflowed to form the second shielding layer 104.

In one embodiment, the solder may be a metal including tin, tin-silver, tin-lead, tin-silver copper, tin silver-zinc, tin zinc, tin bismuth indium, tin indium, tin gold, tin copper, tin zinc indium, tin-silver antimony, or a combination thereof.

In some other embodiments, the first shielding layer 103 may be a shielding layer for the magnetic field, and the second shielding layer 104 may be a shielding layer for the electric field. In some other embodiments, the first shielding layer 103 may be a shielding layer for the electric field, and may be used for shielding the electric field. The second shielding layer 104 may be a shielding layer for the magnetic field, and may be used for shielding the magnetic field. By forming the first shielding layer and the second shielding layer with the above structure, the first shielding layer and the second shielding layer may shield the electric field and the magnetic field respectively, and the shielding performance of the shielding layer may be improved. When the second shielding layer 104 is the electric field shielding layer, the second shielding layer 104 (the electric field shielding layer) may be made of a material including copper, tungsten, or aluminum. When the second shielding layer 104 is a magnetic field shielding layer, the second shielding layer 104 (the magnetic field shielding layer) may be made of a material including CoFeB alloy, CoFeTa, NiFe, Co, CoFe, CoPt, or Ni—Co—Fe alloy. The second shielding layer 104 may be formed by a sputtering process, a physical vapor deposition process, an atomic layer deposition process, a chemical vapor deposition process, or any other suitable processes.

In some embodiments, after forming the second shielding layer, a portion of the first shielding layer on the portion of the base plate at sides of the corresponding semiconductor chip may be removed by etching.

Figure 27:
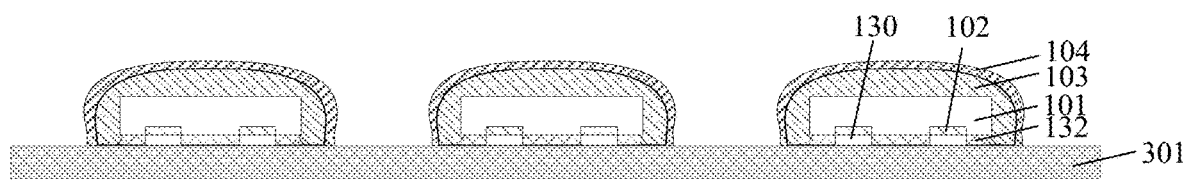

As illustrated in FIG. 27, a portion of the second shielding layer on the portion of the base plate at the sides of the corresponding semiconductor chip may be removed by etching.

In some embodiments, the portion of the second shielding layer on the portion of the base plate at the sides of the corresponding semiconductor chip may be removed by a dry etching process including a plasma etching process.

Figure 28:
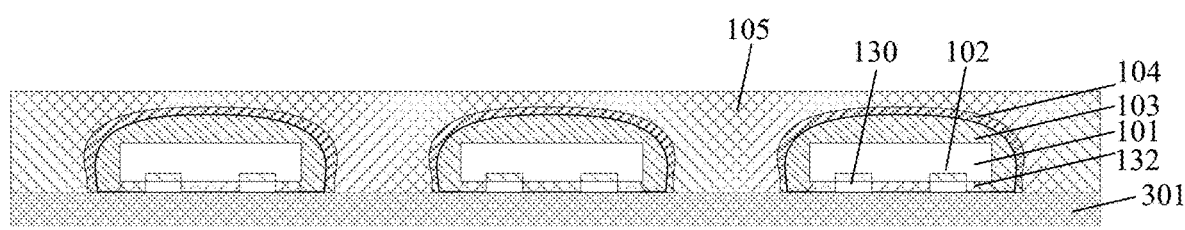

As illustrated in FIG. 28, a plastic encapsulation layer 105 may be formed on the second shielding layers 104 and on the portion of the base plate 301 between the semiconductor chips 101.

The plastic encapsulation layer 105 may be used to seal and fix the semiconductor chips, for forming a pre-packaging plate subsequently.

The plastic encapsulation layer 105 may be made of a material including epoxy resin, polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer, polyvinyl alcohol, or a combination thereof.

The plastic encapsulation layer 105 may be formed by an injection molding process, a transfer molding process, or any other suitable processes.

Figure 29:
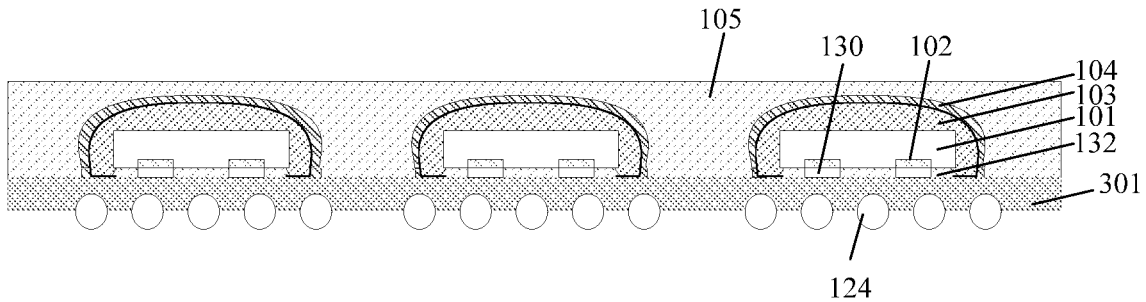

As illustrated in FIG. 29, external contact structures 124 may be formed on the backside of the base plate 301 and connected to the output terminals, to form a pre-packaging plate 10.

In one embodiment, each external contact structure 124 may be a soldering ball. In other embodiments, each external contact structure 124 may include a metal post and a soldering ball on the metal post.

Figure 30:
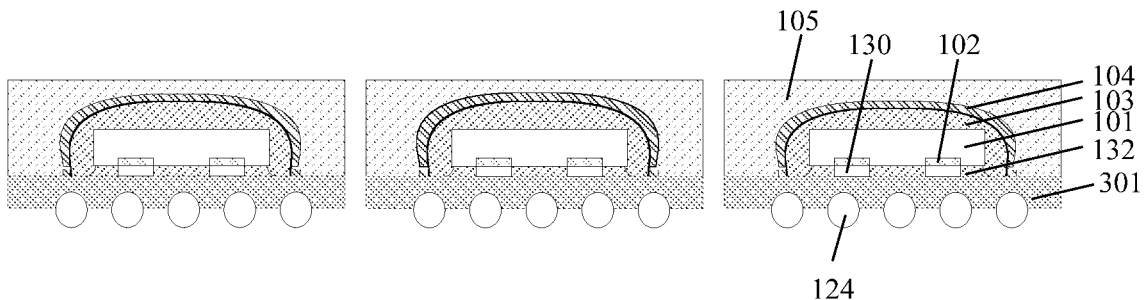

As illustrated in FIGS. 29-30, after forming the external contact structure 124, the packaging plate 10 may be cut to form discrete packaging structure 11.

As illustrated in FIG. 30, each of the discrete packaging structure 11 may include a base plate 301, a semiconductor chip 101, a bottom filling layer 132, a first shielding layer 103, a second shielding layer 104, and external contact structures 124. Wiring structures may be disposed in the base plate 301. Input terminals may be disposed on a front side of the base plate 301, and output terminals may be disposed on a backside of the base plate 301. The input terminals and the output terminals may be connected to the wiring structures respectively.

The semiconductor chip 101 mounted on a front side of the base plate 301 inversely. The semiconductor chip 101 may include a functional surface and a non-functional surface opposite to the functional surface. Soldering pads 102 may be disposed on the functional surface and a metal bump 103 may be formed on each soldering pad 102, in the semiconductor chip 101. Each metal bump 130 on the semiconductor chip 101 may be connected to a corresponding input terminal on the front side of the base plate 301.

The bottom filling layer 132 may be disposed between the functional surface of the semiconductor chip 101 and the front side of the base plate 301.

The first shielding layer 103 may cover the non-functional surface and the sidewalls of the semiconductor chip 101 and sides of the bottom filling layer 132.

The second shielding layer 104 may be disposed on the first shielding layer 103.

In the present disclosure, a massive fabrication of the packaging structure 11 with the first shielding layer 103 and the second shielding layer 014 may be achieved by the above semiconductor integration and fabrication processes. The fabrication efficiency may be improved.

The present disclosure also provides another fabrication method for forming a packaging structure. FIGS. 31-36 illustrate semiconductor structures corresponding to different stages in the fabrication method for forming a packaging structure. In comparison to the previous fabrication method, in the present method, a bottom shielding layer may be formed on the functional surface of the semiconductor chip. The bottom shielding layer may completely cover the functional surface of the semiconductor chip, and have surrounding edges flush with surrounding sidewalls of the semiconductor chip. The soldering pads may penetrate through the bottom shielding layer, and may be separated from the bottom shielding layer through isolation layers. When forming the first shielding layer, the first shielding layer may be connected to the surrounding edges of the bottom shielding layer. In the present method, the second shielding layer may be formed on the first shielding layer after forming the first shielding layer. By forming the second shielding layer on the first shielding layer, the second shielding layer may cover areas of the first shielding layer with an uneven thickness and poor edge coverage, thereby making an overall shield layer formed by the first shielding layer and the second shielding layer complete, to improve shielding performance. Further, the bottom shielding layer may be formed on the functional surface of the semiconductor chip, and when forming the first shielding layer, the first shielding layer may be connected to the surrounding edges of the bottom shielding layer. The semiconductor chip in the packaging structure may be completely or comprehensively covered by the bottom shielding layer and the first shielding layer. Correspondingly, the electric and magnetic field may not enter the packaging structure from a bottom of the packaging structure to induce the electromagnetic interference for the semiconductor chip. Then a completely electromagnetic shielding for the semiconductor chips may be achieved, further improving the electromagnetic shielding performance.

Figure 31:
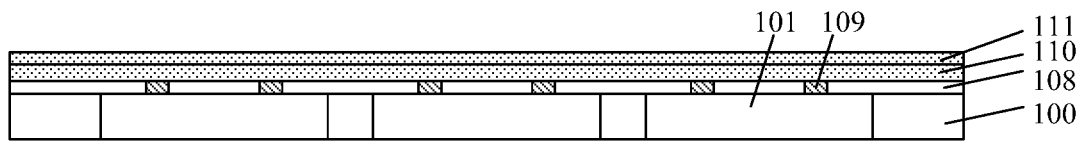
FIGS. 31-36 illustrate structures corresponding to certain stages in another exemplary fabrication method for forming a packaging structure according to various disclosed embodiments of the present disclosure.

Semiconductor chips with the bottom shielding layer may be formed by the following processes. As illustrated in FIG. 31, semiconductor chips 101 on a wafer 100 may be provided. Each semiconductor chip 101 of the semiconductor chips 101 may include a top dielectric layer 108 and a top interconnection structure 109 in the top dielectric layer 108. The semiconductor chip 101 may further include semiconductor devices (such as transistors) formed on a surface of the wafer 100 (or on a semiconductor substrate), interlayer dielectric layers between the top dielectric layer 108 and the surface of the wafer 100. Each of the interlayer dielectric layers may include a corresponding interconnection structure. Interconnection structures in the interlayer dielectric layers may connect upper or lower layers, or electrically connected to the semiconductor devices. The top interconnection structure 109 in the top dielectric layer 108 may be electrically connected to an interconnection structure in an adjacent interlayer dielectric layer of the interlayer dielectric layers.

Subsequently, an isolation layer may be formed on each top dielectric layer 108.

In one embodiment, each isolation layer may have a multilayer structure, and may include a first isolation layer 110 and a second isolation layer 111 on the first isolation layer 110. The first isolation 110 and the second isolation layer 111 may be made of different materials. The first isolation 110 and the second isolation layer 111 may be made of one of $SiO_2$, SiN, or SiNO respectively, to achieve precise control of depth of second openings formed subsequently. Correspondingly, when forming the second openings, an excessive etching of the isolation layer which may induce exposing of a portion of a surface of the top interconnection structure 109 on the top dielectric layer 108 by the second openings and short circuits between top interconnection structures 109 when forming the bottom shielding layer in the second openings, may be prevented.

In some other embodiments, each isolation layer may have a single-layer structure.

Figure 32:
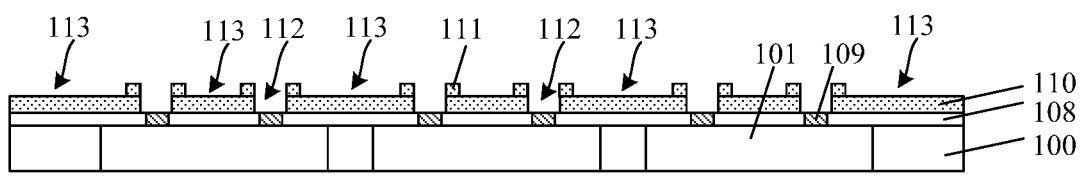

As illustrated in FIGS. 32, the isolation layers may be etched to form first openings 112 and second openings 113 surrounding the first openings 112. A remaining portion of the isolation layers may be only located between the first openings 112 and the second openings 113, to separate the first openings 112 from the second openings 113.

The first openings 112 may be discrete and penetrate through the isolation layers 111. Each first opening 112 may expose a portion of a surface of a corresponding interconnection structure 109. The first openings 112 may be filled with metal to form the soldering pads.

Each second opening 113 may surround a corresponding first opening 112, and may be separated from the corresponding first opening 112 through the isolation layers 111. Each second opening 113 may have a depth smaller than a thickness of the isolation layer. All areas outside the first openings 112 and outside the isolation layer 111 surrounding the first openings 112 may correspond to areas of the second openings 113. The second openings 113 may be connected. When forming the bottom shielding layer in the second openings 113, the bottom shielding layer may cover all areas of the functional surfaces of the semiconductor chips 101 except for the soldering pads (formed in the first openings 112) and the isolation layer surrounding the soldering pads. When forming the first shielding layer on the non-functional surfaces and the sidewalls of the semiconductor chips 101, the first shielding layer may be connected to the surrounding edges of the bottom shielding layer. One of the semiconductor chips in the packaging structure may be completely or comprehensively covered by the bottom shielding layer and the first shielding layer. Correspondingly, the electric and magnetic field may not enter the packaging structure from a bottom of the packaging structure to induce the electromagnetic interference for the semiconductor chips. Then a completely electromagnetic shielding for the semiconductor chips may be achieved, further improving the electromagnetic shielding performance.

In one embodiment, the second isolation layers 111 may be etched using a first etch process with the first isolation layers 110 as a stop layer, to form the second openings in the second isolation layers 111. Subsequently, the second isolation layers 111 and the first isolation layers 110 may be etched using a second etch process, to form the first openings in the second isolation layers 111 and the first isolation layers 110. Before the first and the second etch processes, a corresponding mask layer may be formed on the second isolation layers. In some other embodiment, the second etch process may be performed before the first etch process.

In some other embodiments, each isolation layer may have a single-layer structure, and the first openings and the second openings may be formed by two etch processes respectively. Depth of the second openings may be controlled by controlling the etch time of the etch process (the depth of the second openings may be smaller than the thickness of the isolation layers).

Figure 33:
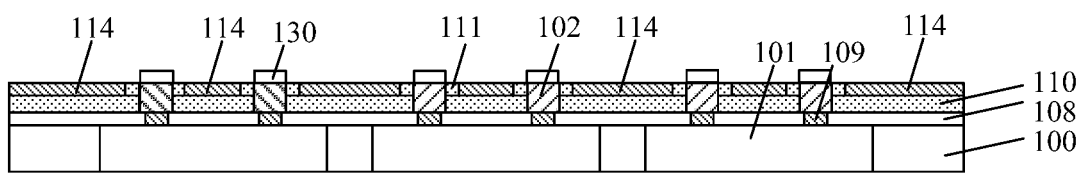
Figure 34:
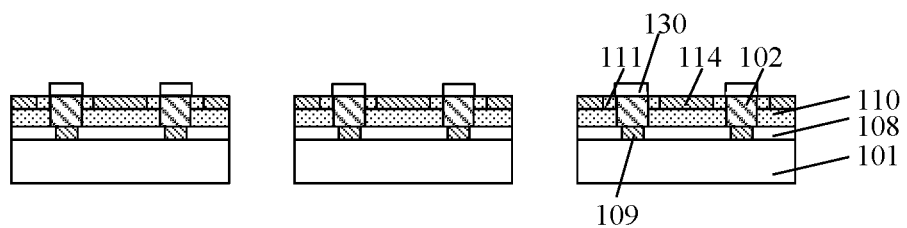

As illustrated in FIG. 33, a soldering pad 102 may be formed in each first opening by filling the first opening with metal, and the bottom shielding layer 114 may be formed in the second openings by filling the second openings with metal. A metal bump 130 may be formed on each soldering pad 102. A first encapsulation layer 132 may be formed covering metal bumps 130 and the bottom shielding layer 114. As illustrated in FIG. 17, after forming the first encapsulation layer 132, the wafer 100 may be cut to form the discrete semiconductor chips 101 with the bottom shielding layer 114.

In some embodiments, soldering pads 102 and the bottom shielding layer 114 may be formed by a same process including: forming a metal material layer in the first openings, in the second openings, and on the isolation layers by a physical vapor deposition process, a sputtering process, or a plating process; planarizing the metal material layer to remove a portion of the metal material layer higher than the surfaces of the isolation layers and form a soldering pad in each first opening and the bottom shielding layer 114 in the second openings. The metal material layer may be made of a material including aluminum, nickel, tin, tungsten, platinum, copper, titanium, chromium, tantalum, gold, silver, or a combination thereof.

Figure 35:
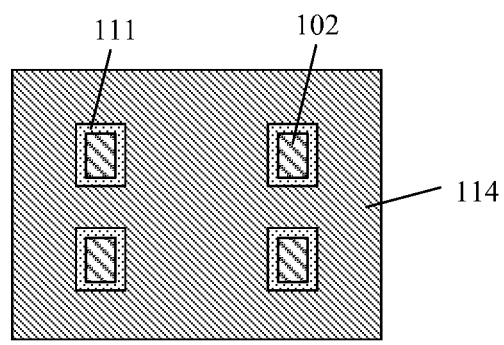

As illustrated in FIG. 35 which is a top view of the soldering pads 102 and the bottom shielding layer 104 in FIG. 14, each semiconductor chip 101 of the discrete semiconductor chips 101 may include the bottom shielding layer 114 on the functional surface, and the bottom shielding layer 114 may cover the whole functional surface of the semiconductor chip 101. The surrounding edges of the bottom shielding layer 114 may be flush with the surrounding sidewalls of the semiconductor chip 101. The soldering pads 102 may penetrate through the bottom shielding layer and may be isolated from the bottom shielding layer 114 by the isolation layers 111.

In the present embodiment, the process for forming the bottom shielding layer 114 may be integrated in the existing fabrication processes of the semiconductor chips, and may be performed synchronically with the process for forming the soldering pads 102. The fabrication process may be simplified, and the process difficulty may be reduced, to improve the efficiency.

Figure 36:
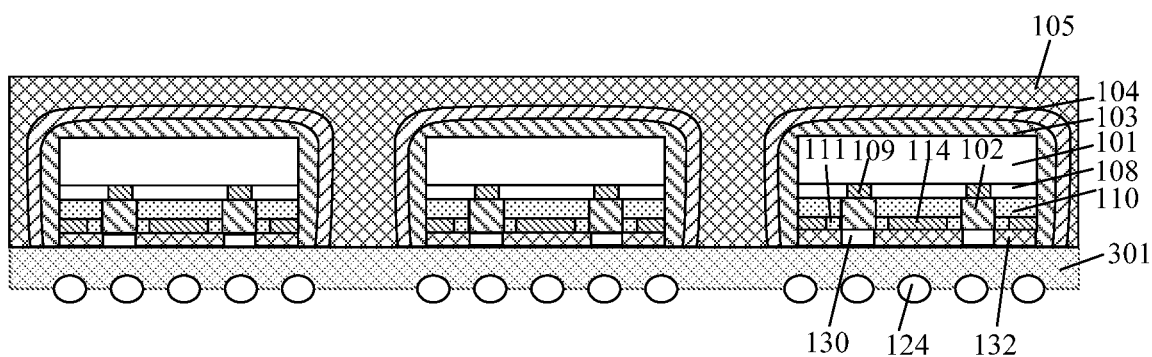

As illustrated in FIG. 36, the fabrication method may further include: mounting the semiconductor chips 114 with the bottom shielding layer 114 on the base plate 301 inversely, to make each metal bump 130 on each semiconductor chip 101 connected to a corresponding input terminal of the base plate 301; forming a bottom filling layer 132 between a functional surface of each semiconductor chip 101 and the front side of the base plate 301; forming a first shielding layer 132 with an ellipsoidal surface covering a non-functional surface and sidewalls of each semiconductor chip 101 and sides of a corresponding bottom filling layer 132; forming a second shielding layer on each first shielding layer 103; forming a plastic encapsulation layer 105 on the second shielding layers 104 and on a portion of the base plate 301 between the semiconductor chips 101; and forming external contact structures 123 on a backside of the base plate 301 and connected to the output terminals.

The present disclosure also provides another packaging structure. As illustrated in FIG. 29 or FIG. 36, the packaging structure may include: a base plate 301, semiconductor chips 101, bottom filling layers 132, first shielding layers 103, second shielding layers 104, and external contact structures 124.

The base plate 301 may include wiring structures. Input terminals may be disposed on a front side of the base plate 301, and output terminals may be disposed on a backside of the carrier plate 301. The input terminals and the output terminals may be connected to the corresponding wiring structures.

The semiconductor chips 101 may be mounted on the front side of the carrier plate 301 inversely, and each metal bump 130 on each semiconductor chip 101 may be connected to a corresponding input terminal on the front side of the base plate 301.

The semiconductor chips 101 may be mounted on the base plate 301 inversely. Each semiconductor chip 101 may include a functional surface and a non-functional surface opposite to the functional surface. Soldering pads 102 may be disposed on the functional surface and a metal bump 103 may be formed on each soldering pad 102, in each semiconductor chip 101. Each metal bump 130 on each semiconductor chip 101 may be connected to a corresponding input terminal on the front side of the base plate 301 by a solder layer.

Each bottom filling layer 132 may be formed between a functional surface of a corresponding semiconductor chip 101 and the front side of the base plate 301.

Each first shielding layer 103 may be formed to cover a non-functional surface and sidewalls of a corresponding semiconductor chip 101 and sides of a corresponding bottom filling layer 132.

Each second shielding layer 104 may be formed on a corresponding first shielding layer 103.

The external contact structures 124 may be formed on the backside of the base plate 301 and connected to the output terminals.

In one embodiment, the first shielding layers 103 may be formed by a dispensing process or a mesh printing process directly on the non-functional surface and sidewalls of a corresponding semiconductor chip 101. The second shielding layers 104 may be formed by a sputtering process, a selective plating process, a dispensing process, or a mesh printing process. The first shielding layers 103 may be made of a material including solder or conductive silver paste, and the second shielding layers 104 may be made of a material including copper, tungsten, or aluminum, solder, or conductive silver paste.

In some embodiments, the packaging structure may further include an intermediate material layer on the non-functional surface and sidewalls of each semiconductor chip 101, and the intermediate material layer may have an ellipsoidal surface. The first shielding layer may be formed on a corresponding intermediate material layer, and may have an ellipsoidal surface.

In some embodiments, each first shielding layer 103 may be a magnetic field shielding layer, and each second shielding layer 104 may be an electric field shielding layer. In some other embodiments, each first shielding layer 103 may be an electric field shielding layer, and each second shielding layer 104 may be a magnetic field shielding layer. The electric field shielding layer may be made of a material including copper, tungsten, or aluminum. The magnetic field shielding layer may be made of a material including CoFeB alloy, CoFeTa, NiFe, Co, CoFe, CoPt, or Ni—Co—Fe alloy.

In some embodiments as illustrated in FIG. 36, a bottom shielding layer 114 may be formed on a functional surface of each semiconductor chip 101. In each semiconductor chip 101, a corresponding bottom shielding layer 114 may cover the whole functional surface of the semiconductor chip 101, and may have surrounding edges flush with surrounding sidewalls of the semiconductor chip 101. The soldering pads 102 may penetrate through the bottom filling layers 114, and may be isolated from the bottom filling layers 114 through isolation layers 111. The first shielding layers 103 may be connected to the surrounding edges of the bottom shielding layers 114.

Each external contact structure 124 may include a soldering ball, or a metal post and a soldering ball on the metal post.

In another embodiment, the packaging structure may further include conductive contact structure in the base plate 301 and electrically connected to the first shielding layers 103.

In the present disclosure, the semiconductor chips may be mounted on the front surface of the base plate inversely, and the bottom filling layers may be formed between the functional surfaces of the semiconductor chips and the front surface of the base plate. The first shielding layers may be formed to cover the non-functional surfaces and the sidewalls of the semiconductor chips and the sidewalls of the bottom filling layers. A second shielding layer may be formed on each first shielding layer. Then the plastic encapsulation layer may be formed on the second shielding layers and on the portion of the base plate between the semiconductor chips. The external contact structures connected to the output terminals may be formed on the back surface of the base plate. By forming the second shielding layer on the first shielding layer, the second shielding layer may cover a portion of the first shielding layer with uneven thickness and poor edge coverage. The overall shielding layer formed by the first shielding layer and the second shielding layer may be complete. The shielding performance may be improved. And an integrated packaging of the semiconductor chips including the first shielding layers and the second shielding layers with the base plate may be achieved.

The second shielding layer may be only located on a portion of the first shielding layer on the non-functional surfaces and the sidewalls of the semiconductor chips, and may have an ellipsoidal surface. The second shielding layer may be formed by a selective plating process, a dispersing process, or a mesh printing process. The second shielding layer may cover the first shielding layer to prevent forming of an area with poor coverage in the second shielding layer, further improve the integrity of the overall shielding layer formed by the first shielding layer and the second shielding layer. Subsequently, no extra mask or etching process may be necessary for removing the semiconductor chips.

The first shielding layer is a magnetic field shielding layer and the second shielding layer is an electric field shielding layer; or the first shielding layer is an electric field shielding layer and the second shielding layer is a magnetic field shielding layer. By forming the first shielding layer and the second shielding layer with the above structure, the first shielding layer and the second shielding layer may shield the electric field and the magnetic field respectively, and the shielding performance of the shielding layer may be improved. The second shielding layer may cover a portion of the first shielding layer with uneven thickness and poor edge coverage. The overall shielding layer formed by the first shielding layer and the second shielding layer may be complete. The shielding performance may be improved.

After forming the external contact structures, the pre-packaging plate may be cut, to form discrete packaging structures. Massive fabrication of the packaging structure with the first shielding layer and the second shielding layer may be achieved, to improve fabrication efficiency.

The bottom shielding layers may be formed on the functional surfaces of the semiconductor chips. The bottom shielding layers may completely cover the functional surfaces of the semiconductor chips, and have surrounding edges flush with surrounding sidewalls of the semiconductor chips. The soldering pads may penetrate through the bottom shielding layers, and may be separated from the bottom shielding layers through the isolation layers. When forming the first shielding layer, the first shielding layer may be connected to the surrounding edges of the bottom shielding layer. In the present method, the second shielding layer may be formed on the first shielding layer after forming the first shielding layer. By forming the second shielding layer on the first shielding layer, the second shielding layer may cover areas of the first shielding layer with an uneven thickness and poor edge coverage, thereby making an overall shield layer formed by the first shielding layer and the second shielding layer complete, to improve shielding performance. Further, the bottom shielding layer may be formed on the functional surfaces of the semiconductor chips, and when forming the first shielding layer, the first shielding layer may be connected to the surrounding edges of the bottom shielding layer. One of the semiconductor chips in the packaging structure may be completely or comprehensively covered by the bottom shielding layer and the first shielding layer. Correspondingly, the electric and magnetic field may not enter the packaging structure from a bottom of the packaging structure to induce the electromagnetic interference for the semiconductor chips. Then a completely electromagnetic shielding for the semiconductor chips may be achieved, further improving the electromagnetic shielding performance.

The semiconductor chips with the bottom shielding layers may be formed by: providing the wafer; forming the semiconductor chips on the wafer where each semiconductor chip includes a top dielectric layer and a top interconnection structure in the top dielectric layer; forming an isolation layer on each top dielectric layer; etching the isolation layer to form first openings and second openings surrounding the first openings in the isolation layer, where a remaining portion of the isolation layer is only located between the first openings and the second openings to separate the first openings from the second openings; filling the first openings with metal to form the soldering pads; filling the second openings with metal to form the bottom shielding layer; forming the metal bumps on the soldering pads; and after forming the metal bumps, cutting the wafer to form the semiconductor chips with the bottom shielding layers. The bottom shielding layers may be formed, and an integration of the process for forming the bottom shielding layers and the process for forming the semiconductor chips may be achieved. The process for forming the bottom shielding layers and the process for forming the soldering pads may be performed simultaneously. The fabrication process may be simplified, the process difficulty may be reduced, and the efficiency may be improved.

The semiconductor chips may be mounted on the front surface of the base plate inversely, and the bottom filling layers may be formed between the functional surfaces of the semiconductor chips and the front surface of the base plate. The first shielding layers with the ellipsoidal surfaces may be formed to cover the non-functional surfaces and the sidewalls of the semiconductor chips and the sidewalls of the bottom filling layers. A second shielding layer may be formed on each first shielding layer. Then the plastic encapsulation layer may be formed on the second shielding layers and on the portion of the base plate between the semiconductor chips. The external contact structures connected to the output terminals may be formed on the back surface of the base plate. The first shielding layer with the ellipsoidal surface may evenly and completely cover the non-functional surfaces and the sidewalls of the semiconductor chip and the sidewalls of the bottom filling layer, and when forming the second shielding layer on the first shielding layer, uneven thickness and poor edge coverage in the second shielding layer may be prevented. The overall shielding layer formed by the first shielding layer and the second shielding layer may be complete. The shielding performance may be improved. And an integrated packaging of the semiconductor chips including the first shielding layers and the second shielding layers with the base plate may be achieved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method for a packaging structure, comprising:
   providing semiconductor chips, wherein each semiconductor chip includes a functional surface and a non-functional surface opposite to the functional surface;
   providing soldering pads on functional surfaces of the semiconductor chips, and a metal bump on each soldering pad;
   providing a base plate, wiring structures in the base plate, input terminals on a front surface of the base plate, and output terminals on a back surface of the base plate, wherein the input terminals and the output terminals are connected to corresponding wiring structures respectively;
   mounting the semiconductor chips on the front surface of the base plate inversely, wherein each metal bump on the semiconductor chips is connected to a corresponding input terminal on the front surface of the base plate;
   forming a bottom filling layer between the functional surface of each semiconductor chip and the front surface of the base plate;
   forming a bottom shielding layer and an isolation layer, interlaced along a lateral direction of the base plate over the bottom filling layer, wherein each soldering pad penetrates through the interlaced isolation layer;
   forming a first shielding layer covering the non-functional surface and sidewalls of each semiconductor chip, and covering sidewalls of a corresponding bottom filling layer, and further being in contact with edges of the bottom shielding layer;
   forming a second shielding layer on each first shielding layer;
   forming a plastic encapsulation layer on second shielding layers and on a portion of the base plate between semiconductor chips; and
   forming external contact structures on the back surface of the base plate and connected to the output terminals.

2. The method according to claim 1, wherein:
   the first shielding layer is formed by a sputtering process and further covers at least a portion of the base plate at sides of a corresponding semiconductor chip; and
   after forming the second shielding layer, a portion of the first shielding layer on the portion of the base plate at the sides of the corresponding semiconductor chip is removed.

3. The method according to claim 2, wherein:
   the second shielding layer is disposed only on a portion of the first shielding layer on the non-functional surfaces and the sidewalls of the corresponding semiconductor chip;
   the second shielding layer has an ellipsoidal surface; and
   the second shielding layer is formed by a selective plating process, a dispersing process, or a mesh printing process.

4. The method according to claim 3, wherein:
   the first shielding layer is made of copper, tungsten, aluminum, or a combination thereof; and
   the second shielding layer is made of copper, solder, conductive silver paste, or a combination thereof.

5. The method according to claim 1, wherein:
   the first shielding layer is a magnetic field shielding layer and the second shielding layer is an electric field shielding layer; or
   the first shielding layer is an electric field shielding layer and the second shielding layer is a magnetic field shielding layer.

6. The method according to claim 5, wherein:
   the electric field shielding layer is made of copper, tungsten, aluminum, or a combination thereof; and
   the magnetic field shielding layer is made of CoFeB, CoFeTa, NiFe, Co, CoFe, CoPt, Ni—Co—Fe alloy, or a combination thereof.

7. The method according to claim 1, wherein:
   surrounding edges of the bottom shielding layer are flush with surrounding sidewalls of the corresponding semiconductor chip.

8. The method according to claim 7, wherein the semiconductor chips with the bottom shielding layers are formed by:
   providing a wafer;
   forming the semiconductor chips on the wafer, wherein each semiconductor chip includes a top dielectric layer and a top interconnection structure in the top dielectric layer;
   forming an isolation layer on the top dielectric layer of each semiconductor chip;
   etching isolation layers to form first openings and second openings surrounding the first openings, wherein a remaining portion of the isolation layers are only located between the first openings and the second openings to separate the first openings from the second openings;
   filling the first openings with metal to form the soldering pads;
   filling the second openings with metal to form the bottom shielding layers;
   forming a metal bump on each soldering pad; and
   cutting the wafer to form the discrete semiconductor chips with the bottom shielding layers.

9. The method according to claim 8, wherein:
   the soldering pads and the bottom shielding layers are formed by a same process including: forming a metal material layer in the first openings and the second openings, and on surfaces of the isolation layers; and planarizing the metal material layer to remove a portion of the metal material layer higher than the surfaces of the isolation layers, to form the soldering pads in the first openings and the bottom shielding layers in the second openings.

10. The method according to claim 1 wherein:
    each external contact structure includes a soldering ball, or a metal post and a soldering ball on the metal post.

11. The method according to claim 1, further including:
    forming conductive contact structures in the base plate, wherein the conductive contact structures are electrically connected to the first shielding layers.

12. The method according to claim 1, further including:
    after forming the external contact structures, cutting the pre-packaging plate to form discrete packaging structures.

13. The method according to claim 1, wherein:
the first shielding layer has an ellipsoidal surface;
the first shielding layer is formed directly on the non-functional surface and the sidewalls of the corresponding semiconductor chip by a dispersing process or a mesh printing process; and
the second shielding layer is formed by a sputtering process, a selective plating process, a dispersing process, or a mesh printing process.

14. The method according to claim 13, wherein:
the first shielding layer is made of solder, conductive silver paste, or a combination thereof; and
the second shielding layer is made of copper, tungsten, aluminum, solder, conductive silver paste, or a combination thereof.

15. The method according to claim 13, before forming the first shielding layer, further including forming an intermediate material layer on the non-functional surface and the sidewalls of each semiconductor chip, wherein:
the intermediate material layer has an ellipsoidal surface;
the first shielding layer is formed on a corresponding intermediate material layer; and
the first shielding layer has the ellipsoidal surface.

16. A packaging structure, comprising:
a base plate, wiring structures in the base plate, input terminals on a front surface of the base plate, and output terminals on a back surface of the base plate, wherein the input terminals and the output terminals are connected to corresponding wiring structures respectively;
semiconductor chips mounted on the front surface of the base plate inversely, wherein each semiconductor chip includes a functional surface, and a non-functional surface opposite to the functional surface, soldering pads on the functional surface, and a metal bump on each soldering pad, wherein each metal bump is connected to a corresponding input terminal on the front surface of the base plate;
a bottom filling layer between a functional surface of each semiconductor chip and the front surface of the base plate;
a first shielding layer surrounding the non-functional surface and sidewalls of each semiconductor chip and a corresponding bottom filling layer;
a second shielding layer on each first shielding layer;
a bottom shielding layer and an isolation layer, interlaced along a lateral direction of the base plate between the functional surface of each semiconductor chip and the bottom filling layer, wherein
the bottom shielding layer includes edges being in contact with a sidewall of the first shielding layer, and
each soldering pad penetrates through the interlaced isolation layer; and
external contact structures connected to the output terminals and on the back surface of the base plate.

17. The packaging structure according to claim 16, wherein:
the first shielding layer is formed by a sputtering process and further covers at least a portion of the base plate at sides of a corresponding semiconductor chip; and
the second shielding layer is formed by a selective plating process, a dispersing process, or a mesh printing process.

18. The packaging structure according to claim 16, wherein:
the first shielding layer has an ellipsoidal surface.

19. The packaging structure according to claim 18, further including an intermediate material layer on the non-functional surface and the sidewalls of each semiconductor chip, wherein:
the intermediate material layer has an ellipsoidal surface;
the first shielding layer is formed on a corresponding intermediate material layer; and
the first shielding layer has the ellipsoidal surface.

20. A discrete packaging structure formed by cutting a package structure, comprising:
a base plate, wiring structures in the base plate, input terminals on a front surface of the base plate, and output terminals on a back surface of the base plate, wherein the input terminals and the output terminals are connected to corresponding wiring structures respectively;
a semiconductor chip mounted on the front surface of the base plate inversely, wherein the semiconductor chip includes a functional surface, a non-functional surface opposite to the functional surface, soldering pads on the functional surface, and a metal bump on each soldering pad, wherein each metal bump is connected to a corresponding input terminal on the front surface of the base plate;
a bottom filling layer between the functional surface of the semiconductor chip and the front surface of the base plate;
a first shielding layer surrounding the non-functional surface and sidewalls of the semiconductor chip and a corresponding bottom filling layer;
a second shielding layer on the first shielding layer;
a bottom shielding layer and an isolation layer, interlaced along a lateral direction of the base plate between the functional surface of each semiconductor chip and the bottom filling layer, wherein
the bottom shielding layer includes edges being in contact with a sidewall of the first shielding layer, and
each soldering pad penetrates through the interlaced isolation layer; and
external contact structures connected to the output terminals and on the back surface of the base plate.

* * * * *